(12) United States Patent
Chakrabartty et al.

(10) Patent No.: US 10,446,234 B2
(45) Date of Patent: Oct. 15, 2019

(54) SELF-POWERED TIMERS AND METHODS OF USE

(71) Applicant: WASHINGTON UNIVERSITY, St. Louis, MO (US)

(72) Inventors: Shantanu Chakrabartty, St. Louis, MO (US); Liang Zhou, St. Louis, MO (US)

(73) Assignee: Washington University, St. Louis, MO (US)

( * ) Notice: Subject to any disclaimer, the term of this patent is extended or adjusted under 35 U.S.C. 154(b) by 0 days.

(21) Appl. No.: 15/792,222

(22) Filed: Oct. 24, 2017

(65) Prior Publication Data

US 2018/0114577 A1 Apr. 26, 2018

Related U.S. Application Data

(60) Provisional application No. 62/412,559, filed on Oct. 25, 2016.

(51) Int. Cl.
| | |
|---|---|
| *G04F 10/10* | (2006.01) |
| *H01L 27/06* | (2006.01) |
| *G11C 16/04* | (2006.01) |
| *H01L 27/11526* | (2017.01) |
| *H01L 49/02* | (2006.01) |

(Continued)

(52) U.S. Cl.
CPC .............. *G11C 16/04* (2013.01); *G04F 10/10* (2013.01); *G11C 16/0408* (2013.01); *G11C 16/0441* (2013.01); *G11C 27/005* (2013.01); *H01L 27/0629* (2013.01); *H01L 27/11526* (2013.01); *H01L 28/40* (2013.01); *G11C 7/04* (2013.01)

(58) Field of Classification Search
CPC . G11C 16/04; G11C 16/0408; G11C 16/0441; G11C 27/005; G11C 7/04; H01L 27/11526; H01L 28/40; G04F 10/10
USPC .......................................................... 327/291
See application file for complete search history.

(56) References Cited

U.S. PATENT DOCUMENTS

| | | | |
|---|---|---|---|
| 6,605,961 B1 * | 8/2003 | Forbes ............. | H03K 19/17712 257/315 |
| 6,674,121 B2 * | 1/2004 | Misra ..................... | B82Y 10/00 257/324 |
| 6,856,581 B1 | 2/2005 | Berstis et al. | |

(Continued)

OTHER PUBLICATIONS

Zhou, L. et al., Self-Powered Sensing and Time-Stamping of Rare Events using CMOS Fowler-Nordheim Tunneling Timers, ResearchGate, Conference Paper May 2016, 5 pages.

*Primary Examiner* — Dinh T Le
(74) *Attorney, Agent, or Firm* — Armstrong Teasdale LLP

(57) ABSTRACT

A timer module including a timer and a compensation circuit coupled to the timer is provided. The timer measures time over a first monitoring period. The timer includes a floating-gate and an energy barrier. The floating-gate stores electrons and has an initial state and a measured state. The measured state includes a current time and a current floating-gate voltage. The energy barrier is positioned adjacent the floating-gate and leaks electrons from an ambient environment of the timer to the floating-gate at a predetermined leakage rate using Fowler-Nordheim (FN) tunneling. The compensation circuit selectably adjusts the first monitoring period to facilitate improved robustness of the timer with respect to fabrication mismatch due to the self-compensating dynamics of FN tunneling.

12 Claims, 25 Drawing Sheets

(51) Int. Cl.
*G11C 27/00* (2006.01)
*G11C 7/04* (2006.01)

(56) References Cited

U.S. PATENT DOCUMENTS

| | | | |
|---|---|---|---|
| 7,630,941 B2 | 12/2009 | Berstis | |
| 7,824,981 B2 * | 11/2010 | Wang | H01L 27/115 |
| | | | 257/315 |
| 8,881,974 B2 | 11/2014 | Dischamp et al. | |
| 8,963,647 B2 | 2/2015 | Chakrabartty | |
| 9,437,602 B2 | 9/2016 | Chakrabartty et al. | |

* cited by examiner

SELF-POWERED TIMERS AND METHODS OF USE

CROSS REFERENCE TO RELATED APPLICATION

This application claims the benefit of and priority to U.S. Provisional Patent Application Ser. No. 62/412,559 filed on Oct. 25, 2016, which is hereby incorporated by reference in its entirety.

STATEMENT REGARDING FEDERALLY SPONSORED RESEARCH & DEVELOPMENT

This invention was made with government support under grant CNR-1525476 awarded by the National Science Foundation, and grant ECCS-1550096 awarded by the National Science Foundation. The U.S. government has certain rights to the invention.

BACKGROUND

The field of this disclosure relates generally to self-powered timers, and more particularly, self-power timers for long-term, accurate time-keeping.

Timers are used in various systems and devices to track time to facilitate time-based analysis and/or calculations. Timers generally include one or more digital, electrical, mechanical, and/or chemical time-keeping mechanisms. Timers are typically embedded into various components or computing devices to facilitate time-based functionality and analysis. However, at least some known timers require power to continuously track time. For passive devices that generate little to no power, such as credit cards and security badges, these known timers may not have sufficient power to track time relatively accurately for extended periods of time.

BRIEF DESCRIPTION

In one aspect, a timer module including a timer and a compensation circuit coupled to the timer is provided. The timer measures time over a first monitoring period. The timer includes a floating-gate and an energy barrier. The floating-gate stores electrons and has an initial state and a measured state. The measured state includes a current time and a current floating-gate voltage. The energy barrier is positioned adjacent the floating-gate and leaks electrons from an ambient environment of the timer to the floating-gate at a predetermined leakage rate using Fowler-Nordheim (FN) tunneling. The compensation circuit selectably adjusts the first monitoring period.

In another aspect, an authentication system including a requesting device, a read-out interface, and an authentication device in communication with the read-out interface is provided. The requesting device stores data for authentication of a requestor and includes a timer module. The timer module includes a floating-gate and an energy barrier. The floating-gate stores electrons and has an initial state and a measured state. The measured state includes a current time and a current floating-gate voltage. The energy barrier is positioned adjacent the floating-gate and leaks electrons from an ambient environment of the timer module to the floating-gate at a predetermined leakage rate using FN tunneling. The stored data of the requesting device includes the current floating-gate voltage of the measured state. The read-out interface retrieves the stored data from the requesting device when the requesting device is positioned within a communication range of the read-out interface. The authentication device receives the retrieved data from the read-out interface, generates an authentication token at least partially as a function of the current floating-gate voltage, and authenticates the requestor based at least in part on the generated authentication token.

DETAILED DESCRIPTION

Figure 1:
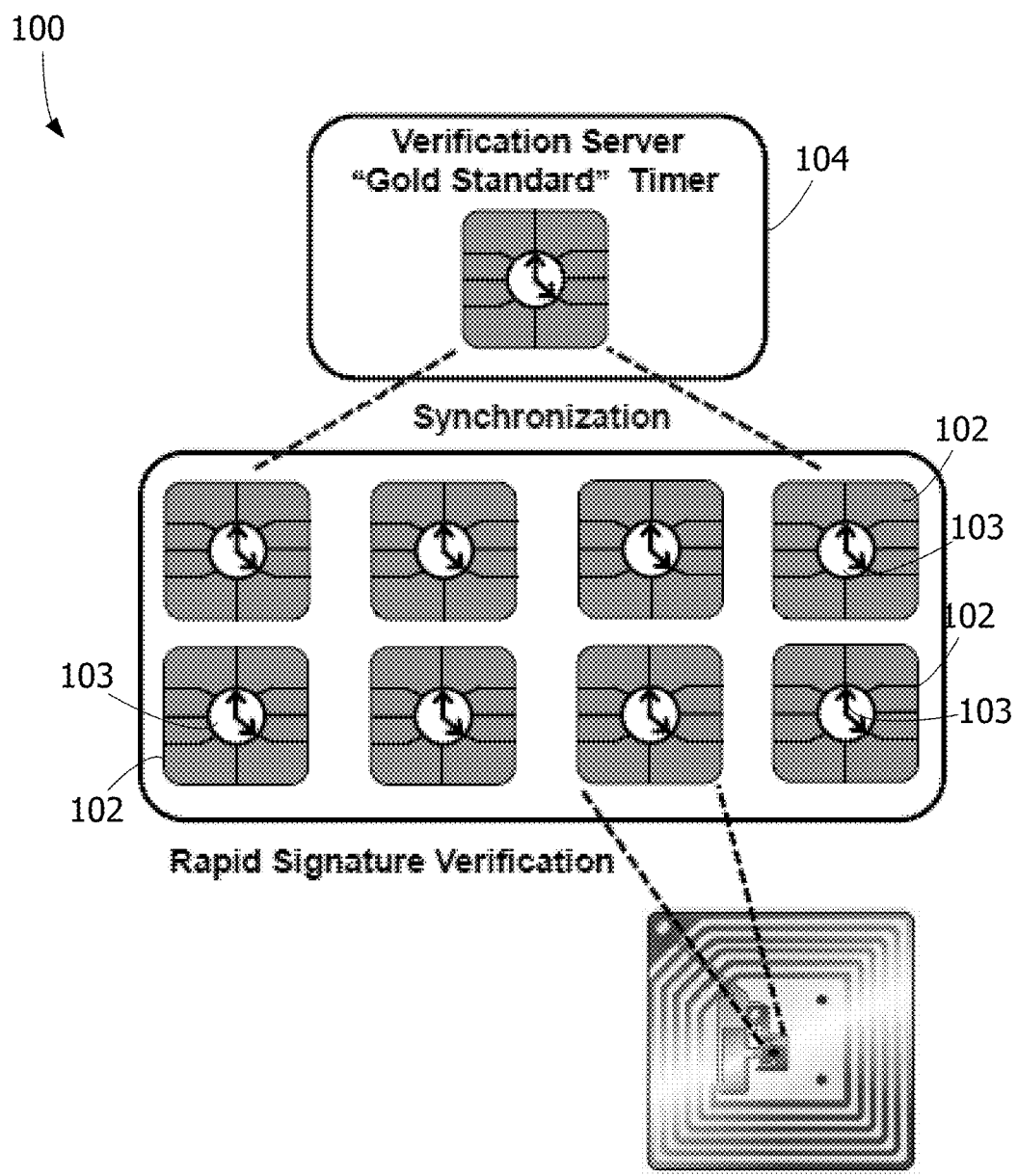
FIG. 1 is an example diagram of passive assets with integrated, self-powered timers for dynamic authentication.

The systems and methods described herein generally relate to self-powered integrated circuit (IC) timers for long-term time-keeping, and in particular, passive authentication devices with integrated, self-powered timers for dynamic authentication techniques.

More specifically, the systems and methods described herein include a requesting device, a read-out interface, and an authentication device in communication with the read-out interface. The requesting device is a passive authentication device (e.g., a credit card, security badge, etc.) associated with a requestor. The requestor is a user attempting to gain permission to perform a secure action (e.g., complete a financial transaction, access a computing device, etc.) that requires the user be authenticated. The requesting devices stores requestor data associated with the requestor for an authentication process performed by the authentication device. The requesting device includes an integrated circuit (IC) timer module that is configured to maintain a substantially continuous time measurement. The IC timer module generates a timer output representative of a current time and is self-powered for extended monitoring periods, such as the life-cycle of the requesting device. In at least some embodiments, the requesting device further includes a random number generator coupled to the timer module. The random number generator receives the timer output from the timer module and generates a randomized authentication token based on the timer output. The generated authentication toke is included with the stored requestor data on the requesting device. In other embodiments, the timer output is included with the requestor data.

To verify his or her identity (i.e., for security purposes), the requestor positions the requesting device within a communication range of the read-out interface. The read-out interface provides power to the requesting device to collect the stored requestor data (including the authentication token and/or the timer output). Once collected, the requestor data is transmitted to the authentication device to perform an authentication process. In some embodiments, the authentication device determines the current time measurement of the timer module represented by the timer output. During the authentication process, the authentication device is configured to authenticate the requestor based at least in part on the authentication token to facilitate improved security of the authentication process. In the example embodiment, the authentication device receives the authentication token. In other embodiments, the authentication device generates at least one authentication token at least partially as a function of the timer output. The authentication token is compared to a verified token stored or otherwise retrieved by the authentication device to determine whether or not the requestor is authenticated. In other embodiments, the authentication device performs a different analysis or calculation with the authentication token and/or the timer output to authenticate the requestor. The authentication device generates an authentication output from the authentication process that indicates whether or not the requestor has been authenticated.

In some embodiments, the timer module includes one or more timers and a compensation circuit. The timers include a floating-gate transistor device and an energy barrier (e.g., an oxide barrier) surrounding the floating-gate transistor device. The floating-gate transistor device is a non-volatile memory device for accumulating electrons over a monitoring period (also referred to as the "timer response"). In particular, the floating-gate transistor device includes a floating-gate that accumulates electrons. The energy barrier leaks electrons from the ambient environment (e.g., thermal noise) to the floating-gate using Fowler-Nordheim (FN) tunneling at a predetermined rate. The floating-gate has an initial state and a measured state. The initial state includes an initial voltage at the floating-gate and an initial time. The measured state includes a measured floating-gate voltage (also referred to as a "timer output") and a corresponding current time. The current time associated with a floating-gate voltage is determined at least partially as a function of the floating-gate voltage and the predetermined leakage rate. In some embodiments, the timer module includes multiple timers having separate timer outputs to facilitate additional error and tampering protection, such as averaging timer outputs and identifying timers that have been tampered with. The compensation circuit adjusts the monitoring period of the timer module and causes the timer module to generate a quasi-linear timer output. In other embodiments, different timer modules are used to maintain a substantially continuous and relatively accurate time measurement for authentication systems. In certain embodiments, the timer modules described herein may be used in systems other than authentication systems.

Authentication techniques using encryption, strong hash functions and pseudorandom number generators are used to provide secure access to critical data and assets. As used herein, "dynamic authentication" refers to authentication techniques that require an authenticating device to perform calculations on data received from a requestor to determine an authentication status (authenticated or declined). For example, in one dynamic authentication technique, a requestor submits a key value or encrypted data to the authenticating devices for decryption and authentication of the requestor based on the decrypted data. However, for passive assets like credit cards and passive Internet-of-Things (IoT) devices like radio-frequency identification (RFID) tags and sensors, the use of these dynamic techniques are impractical due to limited computational bandwidth and limited availability of energy. In addition, a lack of access to a continuously running system clock on these devices prevents the use of dynamic authentication techniques like SecureID® (RSA Security LLC of Bedford, Mass.) that periodically generate and synchronously refresh random keys for increased security. In this regard, zero-power and self-powered timers that operate without any external powering may overcome this limitation and provide a mechanism for dynamic authentication of passive assets.

FIG. 1 is an example diagram 100 illustrating different passive assets 102 (e.g., credit cards and tags) with integrated, self-powered timers 103 that are synchronized with respect to a "gold-standard" timer 104 located on a centralized server (104). That is, the self-powered timers 103 are synchronized relative to the time output generated by the gold-standard timer 104. The self-powered timers 103 are configured to continuously track time using power harvested or collected by the timers 103. In some embodiments, the gold-standard timer 104 is the same type of timer as the self-powered timers 103. In other embodiments, the gold-standard timer 104 is a different type of timer (e.g., a software-based timer) and is configured to match or emulate the response of the self-powered timers 103.

Rapid trust verification and authentication is achieved by comparing synchronized tokens (e.g., random numbers) that are seeded using the outputs from the synchronized timers 103. In comparison to at least some known static authentication methods (e.g., using barcodes or static hardware signatures), this dynamic approach using self-powered timers 103 facilitates improved security and makes the passive assets 102 generally resistant to fraud, counterfeiting, and/or tampering.

In one example, a synchronized timer 103 is embedded into a credit card. The timer 103 is configured to power itself and track time. When the card is inserted into a point of sale (POS) device (not shown) to complete a financial transaction, data representing the current time stored by the timer 103 serves as a seed for a random number generator circuit integrated on the card (not shown in FIG. 1) to generate a randomized authentication token. A second randomized authentication token is generated by an authentication device (not shown) in communication with the POS device using the time of the gold-standard timer 104 The generated authentication tokens are compared to each other to determine whether or not the tokens match. If the tokens match, then the credit card is at least partially authenticated (i.e., other authentication techniques may be used in combination with the timer 103).

Figure 2:
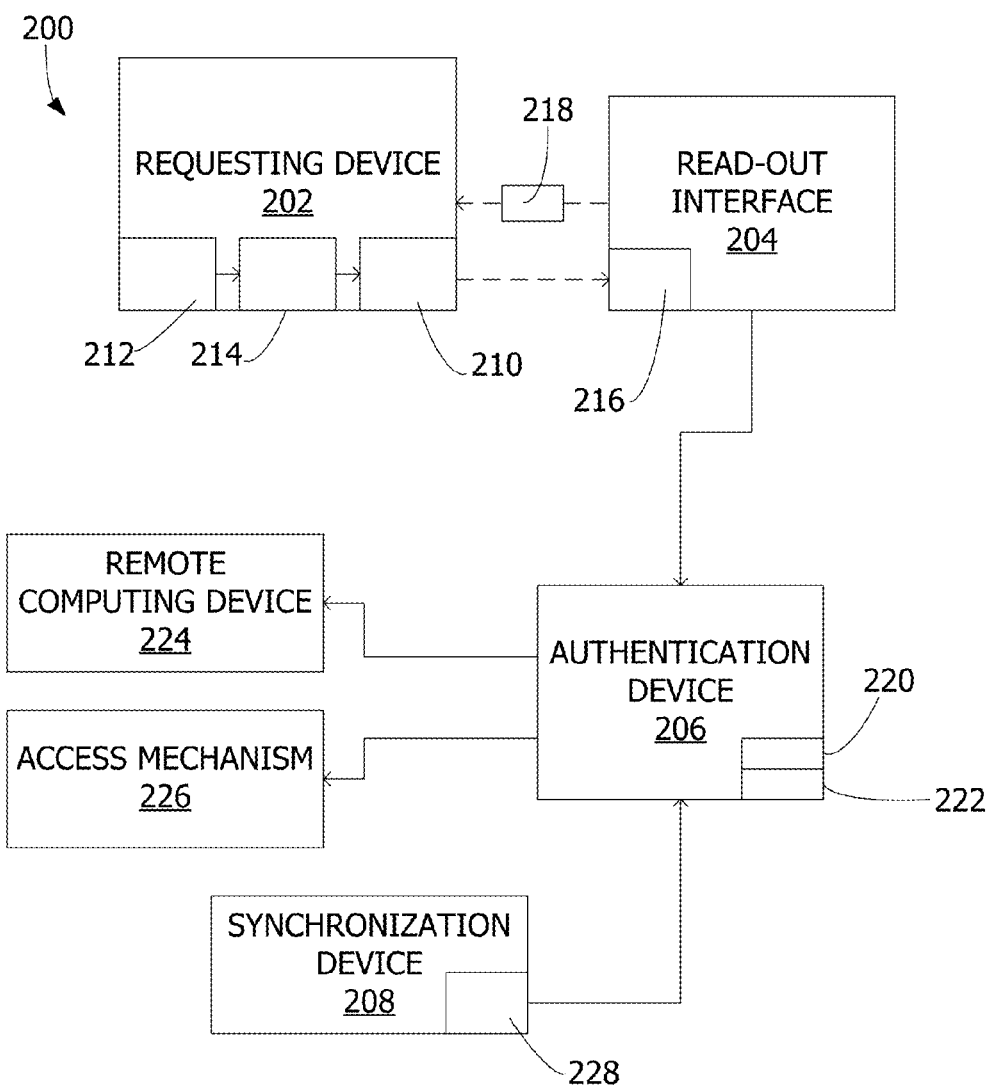
FIG. 2 is a block diagram of an example timer system that includes the self-powered timers of FIG. 1.

FIG. 2 is a block diagram of an example authentication system 200 for performing dynamic authentication using self-powered timers. The system 200 includes a requesting device 202, a read-out interface 204, an authentication device 206, and a synchronization device 208. In other embodiments, the system 200 may include additional, fewer, or alternative devices, including those described elsewhere herein.

In the example embodiment, the requesting device 202 is a passive device associated with a requestor. That is, the requesting device 202 stores requestor data 210 that is transmitted using external power (e.g., from read-out interface 204) to authenticate the identity of the requestor. For example, the requesting device 202 may be, but is not limited to, a credit card, an RFID device, a near-field communication (NFC) device, and so forth. The requestor data 210 stored by requesting device 202 includes identification data, such as a name of the requestor or an activation or expiration date. The stored requestor data 210 may also include other data, such as payment information for a credit card. In other embodiments, the requesting device 202 is an active device (e.g., a computing device) that stores the requestor data 210 for authentication.

The requesting device 202 includes one or more self-powered timer modules 212. The self-powered timer module 212 is configured to store and maintain a substantially continuous time output based on leaked electrons as described in detail further below. In the example embodiment, the timer module 212 is configured to provide a voltage measurement ("timer output") that corresponds to a current time at the time of measurement. The voltage measurement is retrievable from the timer module 212 as part of the stored requestor data 210 of the requesting device 202. In other embodiments, the timer module 212 may use a different mechanism to store a substantially continuous time output, such as a digital, chemical, or mechanical mechanism. In some embodiments, the timer module 212 includes a plurality of timers (not shown), each timer having a respective timer output. The timer outputs of the plurality of timers may be used to generate an averaged timer output or to identify a faulty timer, thereby facilitating reduced errors within the timer module 212. The timer module 212 is further configured to power itself using harvested ambient energy from its surrounding environment (e.g., thermal noise). Accordingly, despite requesting device 202 being a passive device with no continuous power, the timer module 212 facilitates continuous time measurements.

In the example embodiment, the requesting device 202 includes additional components and/or sub-systems to facilitate authentication of the requestor. In certain embodiments, the requesting device 202 includes a random number generator circuit 214 coupled to the timer module 212. The random number generator circuit 214 is configured to receive the timer output of the timer module 212, convert the timer output from an analog signal to a digital signal, and generate a randomized authentication token based on the converted timer output. That is, the converted timer output is used as a seed value for generating the authentication token. The authentication token may be, for example, an encryption key, encrypted data, a randomized data output, and so forth. The generated token is included in the stored requestor data 210 for transmission. In other embodiments, the requesting device 202 includes one or more different sub-systems (such as different random number generation circuits). Alternatively, the requesting device 202 may not include any sub-systems.

The read-out interface 204 is configured to communicate with the requesting device 202 and retrieve the stored requestor data 210 (including the voltage measurement from the requesting device 202. In the example embodiment, the read-out interface 204 includes a sensor 216 that is configured to provide a power output 218 to the requesting device 202 to retrieve the stored requestor data 210. More specifically, the power output 218 causes the requesting device 202 to emit a response to the read-out interface 204 that includes the stored requestor data 210. The read-out interface 204 may be, for example, an RFID reader, an NFC reader, a magnetic reader, and the like. In the example embodiment, the read-out interface 204 is communicatively coupled to the authentication device 206 to facilitate authenticating the requestor. The read-out interface 204 transmits the requestor data 210 retrieved from the requesting device 202 to the authentication device 206. In some embodiments, the read-out interface 204 is communicatively coupled to synchronization device 208.

The authentication device 206 includes at least one processor 220 and a memory device 222 in communication with the processor 220. The memory device 222 stores a plurality of computer-readable instructions that, when executed by the processor 220, cause the processor 220 to at least perform an authentication process. The authentication process involves at least one dynamic authentication technique to verify the identity of the requestor. In some embodiments, the authentication device 206 may be multiple computing devices in communication with each other to perform the authentication process. If the requestor is authenticated using the authentication process, the authentication device 206 is configured to notify and/or control one or more systems or devices to permit the requestor to perform a requested action, such as conduct a transaction, unlock a door or other barrier, or access a computing device.

During the authentication process, the authentication device 206 receives the requestor data 210 collected from the requesting device 202. The authentication process may include multiple steps (i.e., separate authentication techniques) that are used in combination to authenticate the requestor. For example, in some embodiments, one or more steps may include comparing at least a portion of the retrieved requestor data 210 to authentication data associated with one or more users (including the requestor) that is stored in the memory device 222 or another memory associated with the authentication device 206. The authentication data is secure, verified data associated with the users. That is, the authentication device 206 assumes the authentication data to accurate. If the compared data matches or is substantially similar, the authentication device 206 may at least partially authenticate the requestor.

In the example embodiment, a dynamic authentication step is performed within the authentication process. In particular, the authentication device 206 extracts the generated authentication token from the retrieved requestor data 210. In other embodiments, the authentication device 206 is configured to extract the timer output of the timer module 212 from the requestor data 210. In one embodiment, the timer output is used to determine the current measured time associated with the timer output. The timer module 212 has a known initial state (i.e., initial voltage and initial time) and a known leakage rate. The authentication device 206 determines the current measured time of the timer module 212 based on the known initial state, the known leakage rate, and the timer output (i.e., the current voltage measurement). In another embodiment, the authentication device 206 compares the timer output (and any known characteristics of the timer module 212) to synchronized, known data stored by the synchronization device 208 to determine the current measured time.

In some embodiments, the authentication device 206 is configured to generate at least one authentication token based on the timer output and/or the current measured time. In one embodiment, the timer output is a seed value used to generate a randomized token value. The authentication device 206 compares the authentication token to a verified token. The verified token may be stored by the authentication device 206 or retrieved from another computing device (e.g., synchronization device 208). If the authentication token and the verified token substantially match, the authentication device 206 at least partially authenticates the requestor. If the tokens do not substantially match, the authentication device 206 declines the requestor or initiates an authentication challenge for the requestor.

In the example embodiment, the authentication device 206 is in communication with one or more remote computing devices 224 or access mechanisms 226. The access mechanism 226 may be a physical mechanism (e.g., a lock, a door, etc.) or a virtual mechanism. When the authentication process is complete for the requestor, the authentication device 206 notifies and/or controls the communicatively coupled computing devices 224 and/or access mechanisms 226 based on the result of the process (i.e., the requestor is authenticated or declined). In one example, if the requestor is authenticated, the authentication device 206 controls a lock mechanism to unlock and permit the requestor access to a corresponding door. In another example, the authentication device 206 notifies a computing device associated with a payment network that the requestor has been authenticated to enable the requestor complete a transaction using a payment card.

In the example embodiment, the synchronization device 208 is configured to facilitate the authentication process performed by the authentication device 206. More specifically, the synchronization device 208 is configured to store and maintain known data. The authentication device 206 assumes that the known data from the synchronization device 208 is accurate, and therefore the requestor data 210 from the requesting device 202 is synchronized to the known data for the authentication process. In the example embodiment, the synchronization device 208 includes a reference timer module 228 (e.g., the gold-standard timer 104 shown in FIG. 1) that generates a reference timer output. The reference timer module 228 may be similar or identical to the timer module 212. In other embodiments, the reference timer module 228 is different from the timer module 212. For example, the reference timer module 228 may be a software-based emulation of the timer module 212 such that the reference timer module 228 includes a substantially similar initial state, measured state, and leakage rate as the timer module 212. The synchronization device 208 is configured to generate the verified token based on the reference timer output and transmit the verified token to the authentication device 206 for comparison. Alternatively, the synchronization device 208 transmits the reference timer output to the authentication device 206 to generate the verified token.

The success of authentication methods using self-powered timers relies on three aspects: (a) long-term operation of the timers such that the operating period matches or exceeds the shelf-life or the life-cycle of the passive asset (at least 5 years); (b) the ability to achieve synchronization across different timers and the "gold-standard" timer irrespective of fabrication mismatch (i.e., differences in physical structure between the gold-standard timer and the other timers due to manufacturing imperfections); and (c) a behavioral model of the timer that can be used to implement the "gold-standard" timer. These three attributes require predictability in timer operation as well as operating parameters of the timers that can be reliably adjusted for calibration and synchronization. The systems and methods described herein include self-powered timer structures based on Fowler-Nordheim (FN) tunneling of electrons onto a floating-gate structure. The physics of FN tunneling, described further below, inherently scavenges thermal activation energy (i.e., thermal noise) and facilitates the self-powering mechanism of the timers. The power levels in thermal-noise (fluctuations) that power the timers lie well below $10^{-18}$-$10^{-16}$ watts (W), which is too scarce for conventional energy scavenging circuits to be operational.

Figure 3:
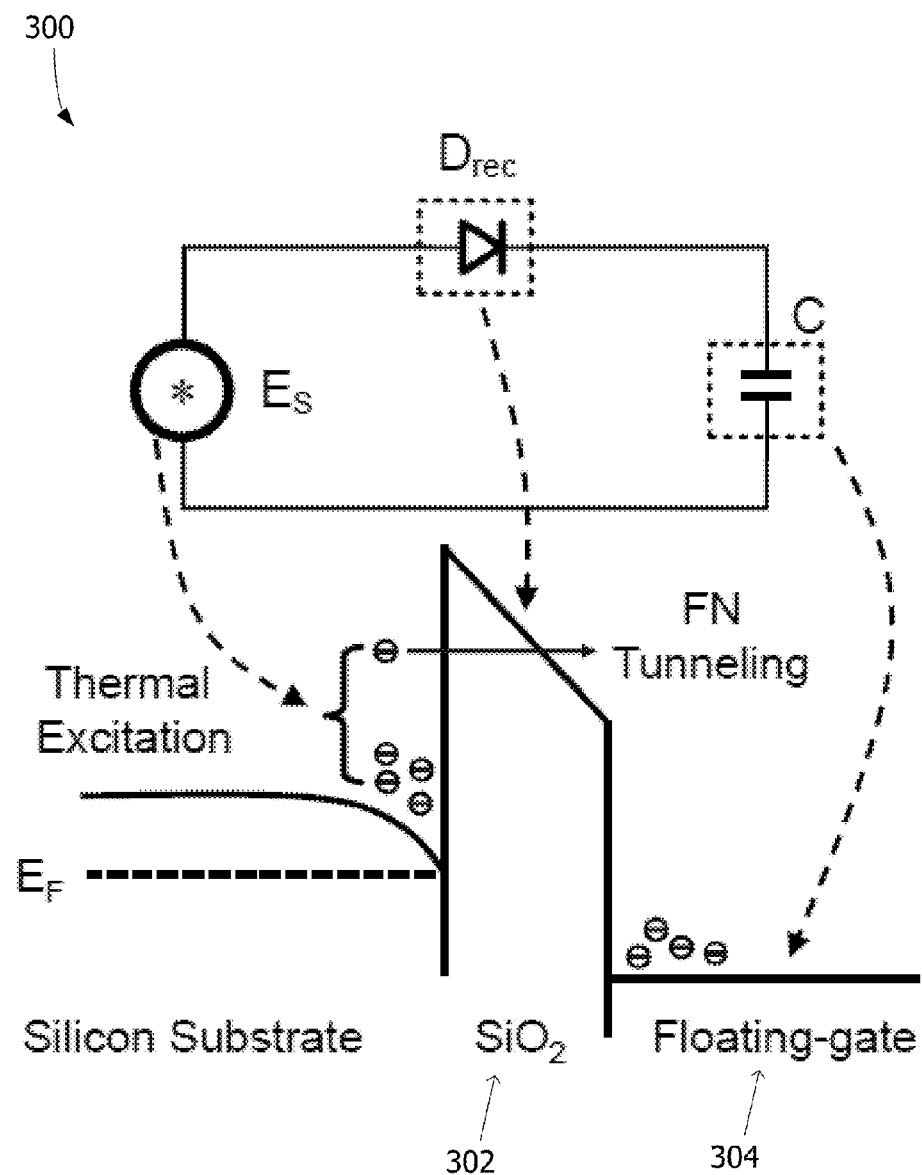
FIG. 3 is a diagram an example self-powered analog timer that may be used in the system shown in FIG. 2.

FIG. 3 is a diagram of an example self-powered analog timer 300 and an equivalent circuit. A rectification diode $D_{rec}$ is implemented using a triangular quantum-mechanical energy barrier 302 coupled to a floating-gate 304 (corresponding to a capacitor C) of a floating-gate transistor device (not shown in FIG. 3). As described further herein, continuous integration of tunneled electrons onto the floating-gate 304 facilitates reliable and robust quasi-linear response which can be used for time-keeping and synchronization. The floating-gate 304 also serves as a non-volatile accumulator or counter. The value stored by the floating gate 304 can be asynchronously interrogated using an externally powered circuit.

In the example embodiment, the timers described herein comprise of a strip of poly-crystalline silicon (polysilicon) that is insulated by high-quality, thermally-grown silicon-dioxide. In other embodiments, different materials that facilitate FN tunneling, such as a metal for the polysilicon strip and silicon nitride for the silicon dioxide, may be used for the timers. The polysilicon strip corresponds to the floating-gate 204 and the silicon-dioxide corresponds to the barrier 202. The polysilicon strip acts as a reservoir of electrons and the surrounding silicon-dioxide is an energy barrier that prevents electrons to leak out (e.g., by thermal excitation or quantum tunneling) from the strip.

Electrons leak through the oxide towards the polysilicon strip using at least one of three mechanisms of quantum tunneling: (a) trap-assisted tunneling in which carriers tunnel through the dielectric layer (i.e., the silicon-dioxide) with the assistance of trap states, (b) direct tunneling in which carriers directly tunnel through a rectangular barrier formed by the dielectric layer, and (c) FN tunneling in which carriers tunnel through a triangular-shaped barrier resulting from a relatively strong electric field. Trap-assisted tunneling is dependent upon a number and distribution of traps, thus making trap-assisted tunneling difficult to control and modulate externally. Trap-assisted tunneling is also negligible in complementary metal-oxide semiconductors (CMOS) floating-gate structures because the oxide is thermally-grown, thereby reducing the volume defects or electron traps for tunneling. Direct tunneling relies on dielectric thickness and becomes prominent when the thickness of the dielectric layer is small (e.g., less than 4 nanometers (nm) for silicon-dioxide). Oxide thickness is a process-specific parameter and cannot be modulated or controlled.

FN tunneling, on the other hand, depends on the shape of the energy barrier across the dielectric layer which can be controlled and modulated by changing an electric field across the dielectric layer. The physics of FN tunneling is a two-step process. Electrons are first thermally excited to an energy level E to cause the electrons to tunnel through the triangular barrier into the floating-gate. The thermal excitation may be provided by ambient thermal noise around the barrier. At the bottom of the energy barrier 302, the oxide thickness is sufficient (e.g., greater than 10 nm in a 0.5 μm CMOS process) to negate the probability of electrons directly tunneling through the bottom of the energy barrier 302. Thus, FN tunneling can be modeled by the equivalent timer 300 where the input energy source is the ambient thermal-activation or thermal-noise and rectification diode is formed by the tunneling barrier 302 whose output is the floating-gate capacitance.

Mathematically, the combination of thermal activation and electron tunneling can be expressed by the FN tunneling current density J in Equation 1 as:

$$J = \frac{2q\pi}{m^2} \int_E^\infty P_T(\zeta)T(\zeta)d\zeta \tag{1}$$

where $P_T(\zeta)$ is the probability density function corresponding to an electron occupying an energy level $\zeta$ and $T(\zeta)$ represents the tunneling probability of the electron and is a function of the barrier thickness. The parameters m and q correspond to the mass and charge of free electrons, respectively. In its general form shown in Equation 1, it is difficult to obtain a closed form expression for FN tunneling current density J, let alone solve a coupled differential equation involving the current density J. Therefore, for simplicity and clarity, several second order effects (e.g., effect of image force and temperature variations) are ignored to consider the following mathematically-tractable form of FN tunneling current density J in Equation 2.

$$J = \alpha E^2 \exp\left(-\frac{\beta}{E}\right) \tag{2}$$

E represents the electric field across the oxide-barrier and the parameters α and β are a function of the material properties of the oxide-barrier. Equations 3 and 4 below are used to determine α and β·m* is the effective mass of electrons in the forbidden gap of the silicon-dioxide, ϕ is the barrier height at the interface of the substrate and the barrier, and h is Planck's constant.

$$\alpha = \frac{mq^3}{8\pi m * h\phi} \tag{3}$$

$$\beta = \frac{4(2m^*)^{\frac{1}{2}}\phi^{\frac{3}{2}}}{3hq} \tag{4}$$

If floating-gate capacitance is defined as $C_T$ and cross-sectional area of the tunneling junction is defined as A, then the incremental change in floating-gate voltage $V_{fg}(t)$ (equivalently the floating-gate charge) can be expressed by the first order differential equation in Equation 5.

$$dV_{fg}(t) = \frac{dQ}{C_T} = \frac{AJ(E)dt}{C_T} \tag{5}$$

Under the assumption of a triangular barrier, the floating-gate voltage $V_{fg}$ and the electric field E are related by oxide-barrier thickness $t_{ox}$ as shown in Equation 6 below. $V_{sub}$ is an effective voltage drop across a substrate of the floating-gate transistor device. In the example embodiment, the substrate is an n-type silicon material. In other embodiments, the substrate is a p-type silicon material.

$$V_{fg}(t) = t_{ox}E(t) + V_{sub} \tag{6}$$

By integrating Equations 2, 5, and 6, the dependence of the electric field E on time t can be expressed by Equation 7. Parameters $k_0$ and $k_1$ are expressed Equation 8, where $E_0$ is an initial electric field across the oxide barrier.

$$E(t) = \frac{\beta}{\ln(k_1 t + k_0)} \tag{7}$$

$$k_0 = \exp\left(\frac{\beta}{E_0}\right), k_1 = \frac{A\alpha\beta}{C_T t_{ox}} \tag{8}$$

Substituting the electric field E into Equation 6, the floating-gate voltage $V_{fg}$ change over time can be expressed as shown in Equation 9. Parameter $k_2$ is defined by Equation 10.

$$V_{fg}(t) = \frac{k_2}{\ln(k_1 t + k_0)} + V_{sub} \tag{9}$$

$$k_2 = \beta t_{ox} \tag{10}$$

Figure 4:
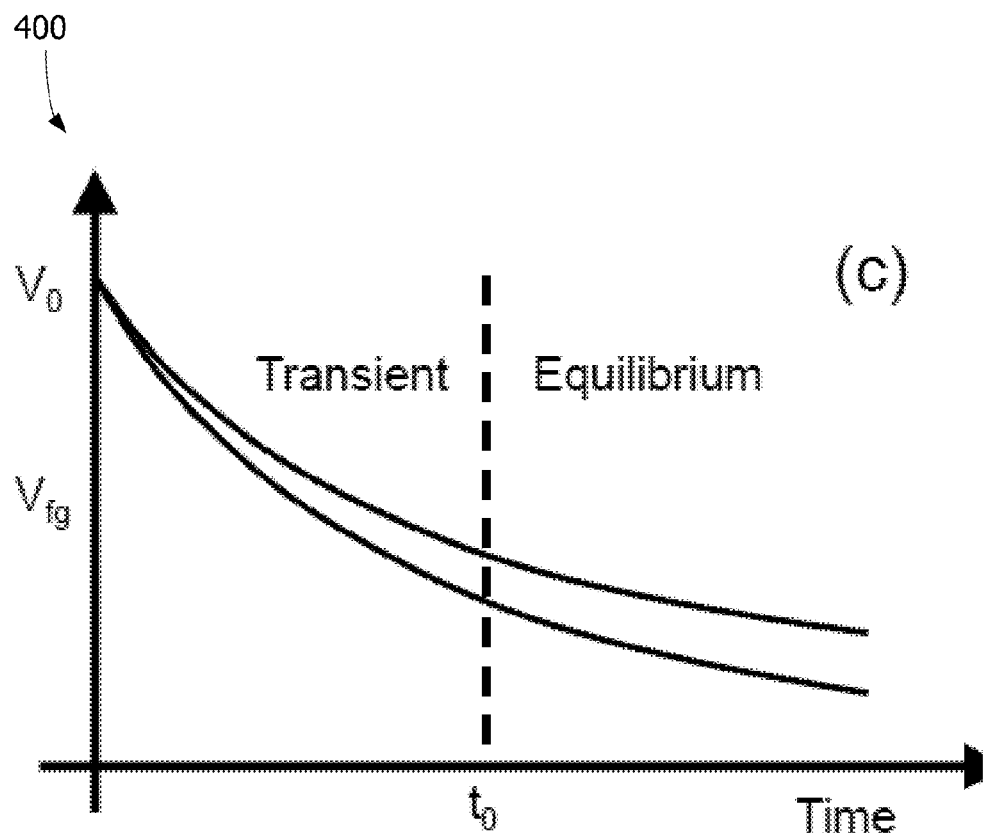
FIG. 4 is a graph illustrating an example response of a timer that may be used in the system shown in FIG. 2.

FIG. 4 is a graph 400 illustrating an example response of the timer according to Equation 9. While the initial timer response is a function of the parameters $k_0$, $k_1$, and $k_2$, for the time intervals $t \gg t_0 \gg k_0/k_1$, the response becomes the function shown in Equation 11.

$$V_{fg}(t) = \frac{k_2}{\ln\left(\frac{t}{t_0}\right)} + V_{sub} \tag{11}$$

Equation 11 reveals two attributes for designing robust long-term timers. First, the floating-gate voltage $V_{fg}$ monotonically decreases and is inversely proportional to a logarithmic function of time. Thus, the rate of decrease of the FN-based timer is slower than an example linear timer and faster than an example saturating response of an RC-type filter. This implies that the FN-based timer may be functional for a long-term duration relevant to dynamic authentication systems. The second attribute revealed by Equation 11 is that the initial timer response is only a function of the parameter $k_2$, which depends only on the material properties $\beta$ and the oxide-thickness $t_{ox}$, as described by Equations 4 and 10. Accordingly, asymptotically, the response of the FN-based timer is theoretically independent of device sizes (the cross-sectional area A and the floating-gate capacitance $C_T$).

Equation 9 shows that the FN-based timer is capable of extended-duration operation. In some embodiments, the saturating response of the timer may be adjusted or calibrated for different monitoring periods. Variable saturating response (i.e., monitoring periods) may be achieved by varying the tunneling junction area A or by varying the floating-gate capacitance $C_T$. While the junction area A cannot be varied post-fabrication, in the example embodiment, the floating-gate capacitance $C_T$ is adjusted through the use of a varactor as illustrated in FIG. 5.

Figure 5:
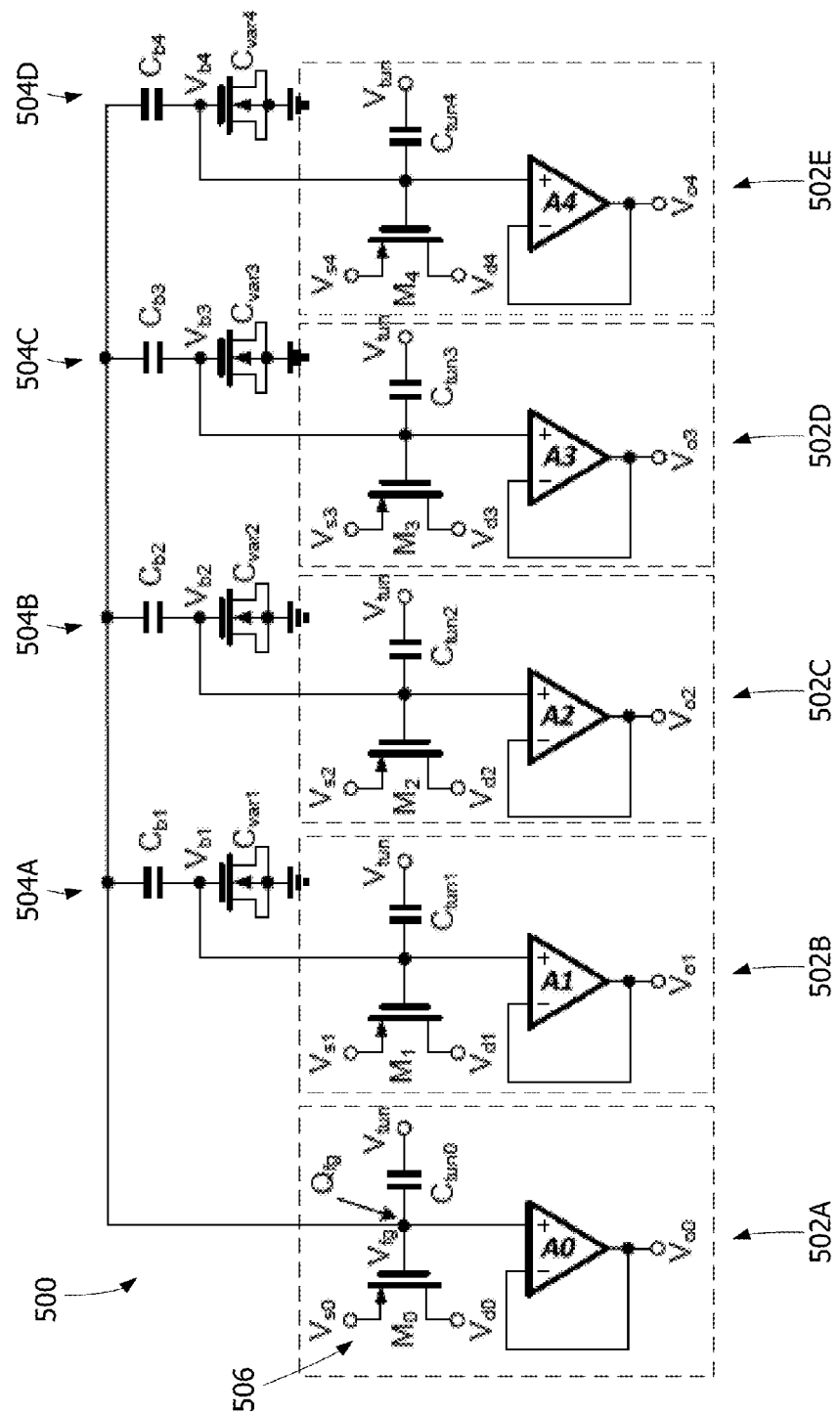
FIG. 5 is an example circuit diagram of a timer module with varactor-based compensation that may be used in the system shown in FIG. 2.

FIG. 5 is an example circuit diagram of a timer module 500 that includes an array of timers 502A-502E (generally referred to herein as "timers 502"). Although the timer module 500 includes five timers, it is to be understood that any number of timers may be included within the timer module 500. The timers 502 are similar to the timers 300 shown in FIG. 3. In addition, timers 502 are further coupled to an array of varactors 504A-504D (generally referred to herein as "varactors 504").

For the timers 502, the differential equation in Equation 5 can be modified as Equation 12.

$$C_T(V_{fg})dV_{fg} = AJ(V_{fg})dt \quad (12)$$

Figure 6:
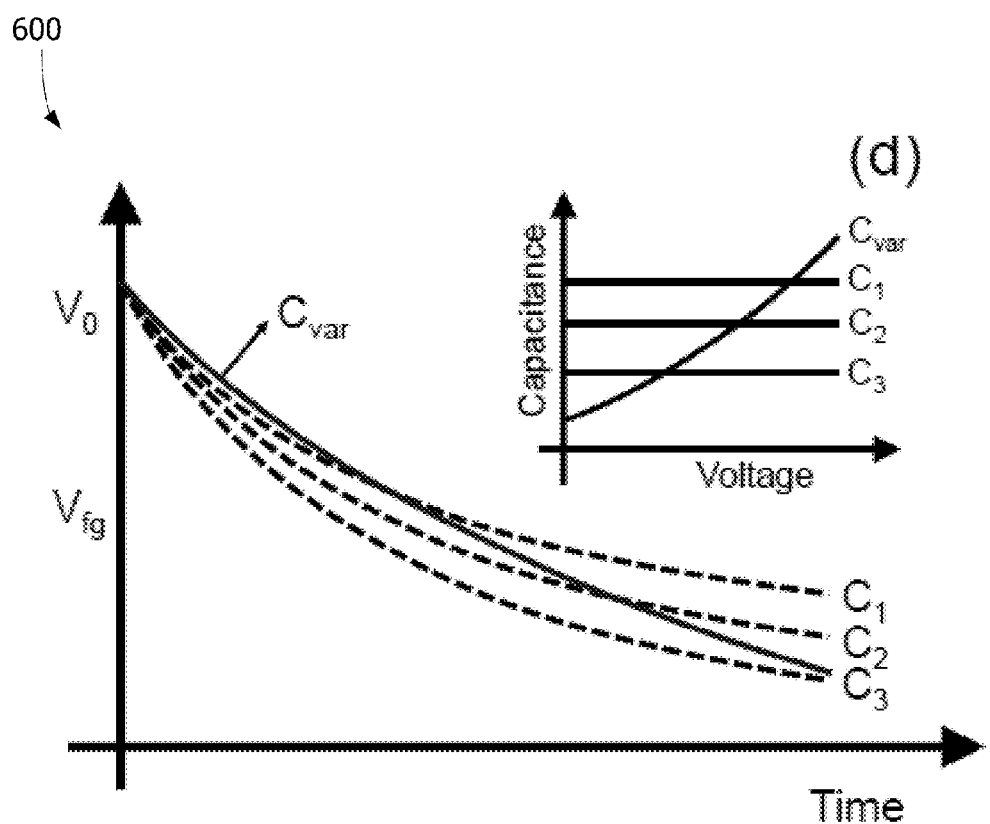
FIG. 6 is a graph depicting example responses of timer with different floating-gate capacitances for the system shown in FIG. 5.

$C_T(V_{fg})$ is the variable capacitance (also referred to as "$C_{var}$") whose magnitude is a function of the floating-gate voltage $V_{fg}$. While a closed-form expression for the floating-gate voltage $V_{fg}$ is not always possible for a variable capacitance $C_T(V_{fg})$, the effect of varactors may be visualized using the timer response curves 600 shown in FIG. 6. Assuming that the variable capacitance $C_T(V_{fg})$ monotonically increases with respect to $V_{fg}$ as shown in FIG. 6, the timer response traverses through the timer responses corresponding the increase in the capacitance $C_1 > C_2 > C_3$. Thus, over the same operating period, the varactor-based timers 502 can achieve a quasi-linear response. For the special case $C_T(V_{fg}) = \gamma J(V_{fg})$, the timer response is reduced to a linear integrator.

With respect to FIG. 5, the floating-gates of the timers 502 are formed by the gates of the pMOS transistors 506 (i.e., the floating-gate transistor devices), which are also used for programming an initial charge onto the floating-gate. Each timer 502 has an initial state and a measured state. The initial state includes an initial voltage and a corresponding initial time. The measured state includes a measured floating-gate voltage $V_{fg}$ (i.e., a timer output) and a corresponding current time. The varactors 504 are each implemented using an NMOS accumulation-mode device, where the capacitance $C_V$ is measured between the gate-terminal and the n-type substrate and is given by Equation 13. $C_{ox}$ is the capacitor formed by the oxide of the accumulation-mode device, and $C_{dep}$ is the capacitance induced in the substrate depletion area of the accumulation-mode device, which is a function of the width $W_{dep}$ of the depletion region as shown in Equation 14. In the example embodiment, $W_{dep}$ depends on the gate potential $V_g$ of the accumulation-mode device 508, the electrical permittivity $\epsilon_s$ of silicon, the substrate doping concentration $N_d$, and the flat-band voltage $V_{fb}$.

$$C_V = \cfrac{1}{\cfrac{1}{C_{ox}} + \cfrac{1}{C_{dep}}} \quad (13)$$

$$C_{dep} = \frac{\epsilon_s}{W_{dep}} \quad (14)$$

$$W_{dep} = -\frac{\epsilon_s}{C_{ox}} + \sqrt{\left(\frac{\epsilon_s}{C_{ox}}\right)^2 + 2\frac{\epsilon_s}{qN_d}|V_g - V_{fb}|} \quad (15)$$

Figure 7:
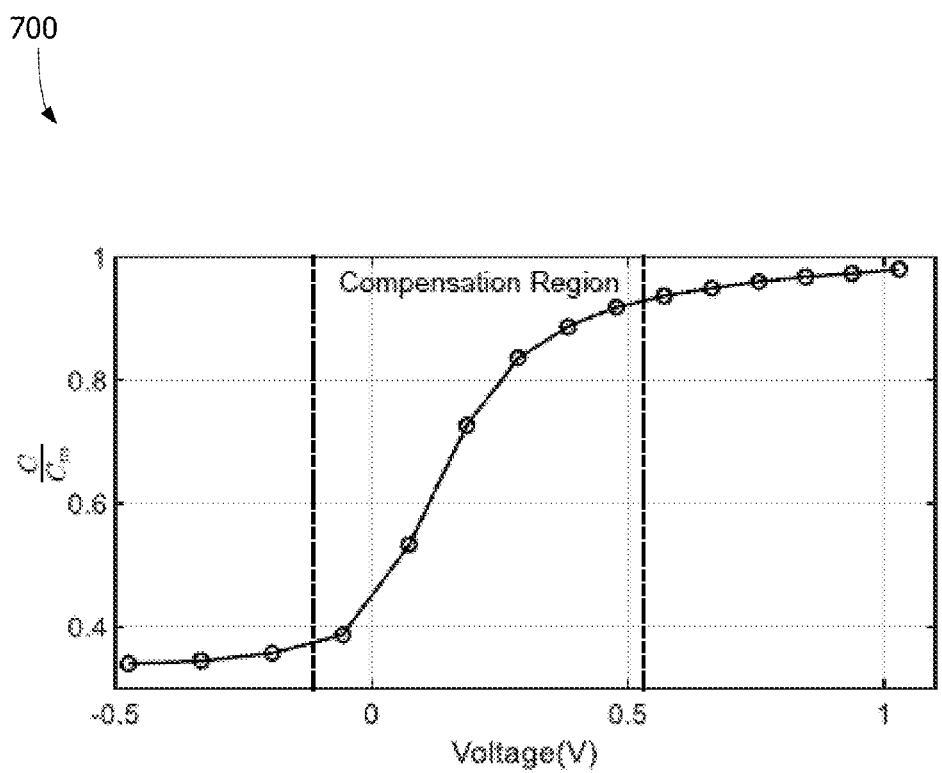
FIG. 7 is a graph depicting the measured C-V characteristics of an example NMOS accumulation mode varactor fabricated using a 0.5-$\mu$m CMOS process.

However, the tuning range of the MOS varactors 504 is limited and a gate voltage $V_g$ of the NMOS accumulation-mode device is chosen such that the substrate is neither completely in accumulation nor depletion mode. For this biasing condition, the change in the variable capacitance $C_{var}$ with respect to the gate voltage $V_g$ is substantially maximized. This is illustrated in FIG. 7 which is a graph 700 depicting the measured C-V characteristics of an example NMOS accumulation mode varactor fabricated using a 0.5-μm CMOS process. The relative change in capacitance is the highest when the floating-gate voltage $V_{fg}$ is in the range of 0-0.3 V.

With respect to again to FIG. 5, biasing requirements on the MOS varactors 504 introduces a challenge when connecting to the tunneling junction of the timers 502. For an example 0.5 μm CMOS process (with a gate oxide thickness $t_{ox}$ greater than 10 nm), FN tunneling requires the floating-gate voltage $V_{fg}$ to be greater than 7 V, whereas the operation of the varactors 504 requires the floating-gate voltage $V_{fg}$ range to be less than 500 mV. A series capacitor configuration is used in the timer module 500 to facilitate proper biasing of the varactors 504 and at the same time achieve isolation of each varactor's gate-oxide from the high FN tunneling voltage (>7V). $C_{bn}$ are double polysilicon capacitors with a capacitance independent of the electrode voltage and are connected to a respective MOS varactor 504A-504D in series. Neglecting the capacitance of a tunneling capacitor $C_{tun}$ and the gate capacitance of the transistor $M_1$, the total capacitance $C_v$ seen at the node $V_{fg}$ is defined by Equation 16.

$$C_V = \frac{C_{var}C_b}{C_{var} + C_b} \quad (16)$$

By choosing $C_b \gg C_{var}$, Equation 16 can be reduced to Equation 17, implying that the change in varactor capacitance $C_{var}$ is reflected as an equivalent change in the floating-gate capacitance $C_v$. The charge on the floating-node $V_b$ is programmed through the tunneling capacitor $C_{tun}$ and through transistor M using hot electron injection.

$$C_V \approx C_{var} \quad (17)$$

The timer module 500 shown in FIG. 5 also overcomes the limited compensation of a single MOS varactor. As shown in FIG. 7, the graph 700 illustrates an example compensation range of a varactor in a range of 300 mV, whereas the effective dynamic range of a timer including the varactor may be greater than 1V. The timer module in FIG. 5 overcomes this issue by using a series capacitor network $C_{bn}$. In the differential form, the floating-node voltage $V_b$ depends on the floating-gate voltage $V_{fg}$ as shown in Equation 18.

$$\Delta V_b = \frac{C_b}{C_b + C_{var}} \Delta V_{fg} = \frac{1}{1 + \frac{C_{var}}{C_b}} \Delta V_{fg} \qquad (18)$$

By choosing an appropriate ratio of the series capacitance $C_b$ and the varactor capacitance $C_{var}$, the compensation range may be extended to the whole life cycle of the timer module 500. However, this strategy uniformly extends the compensation region to a larger range and does not provide freedom to control the compensation characteristics. To overcome this issue, an array of varactors 504 is implemented. In a timer module substantially similar to the timer module 500 shown in FIG. 5, four varactors 504 are employed for diverse compensation schemes. In other embodiments, varactors 504 may include a different number of varactors. By choosing different size form factors and different biasing conditions, the varactors 504 are configured to accommodate the specific characteristics of the timer module. For instance, a binary size configuration for varactors $C_{v1}$-$C_{v3}$ with an area ratio as 1:2:4, the initial bias of $V_{b1}$-$V_{b3}$ is set as 0.5V, 0.4V, and 0.3V respectively. Therefore, initially, the varactor $C_{v3}$ is engaged and provides compensation while the other varactors only provide limited compensation because their respective biases are relatively high and the voltage dependence is relatively weak, as demonstrated in FIG. 7. After a certain time, the varactor $C_{v2}$ is engaged and provides compensation because the tunneling process decreases the floating-gate voltage $V_{fg}$ and subsequently the floating-node voltages $V_{b1}$-$V_{b3}$. This process continues through the life cycle of the timer module such that the varactor $C_{v1}$ is eventually engaged. By doing so, the compensation weights of each varactor are dynamically adjustable. In this example, the varactor $C_{v3}$ is chosen to have the largest relative size to facilitate the relatively fast initial tunneling. At the final period of the timer, the tunneling rate shifts smaller, therefore a relatively small varactor $C_{v1}$ is used for compensation.

Figure 8:
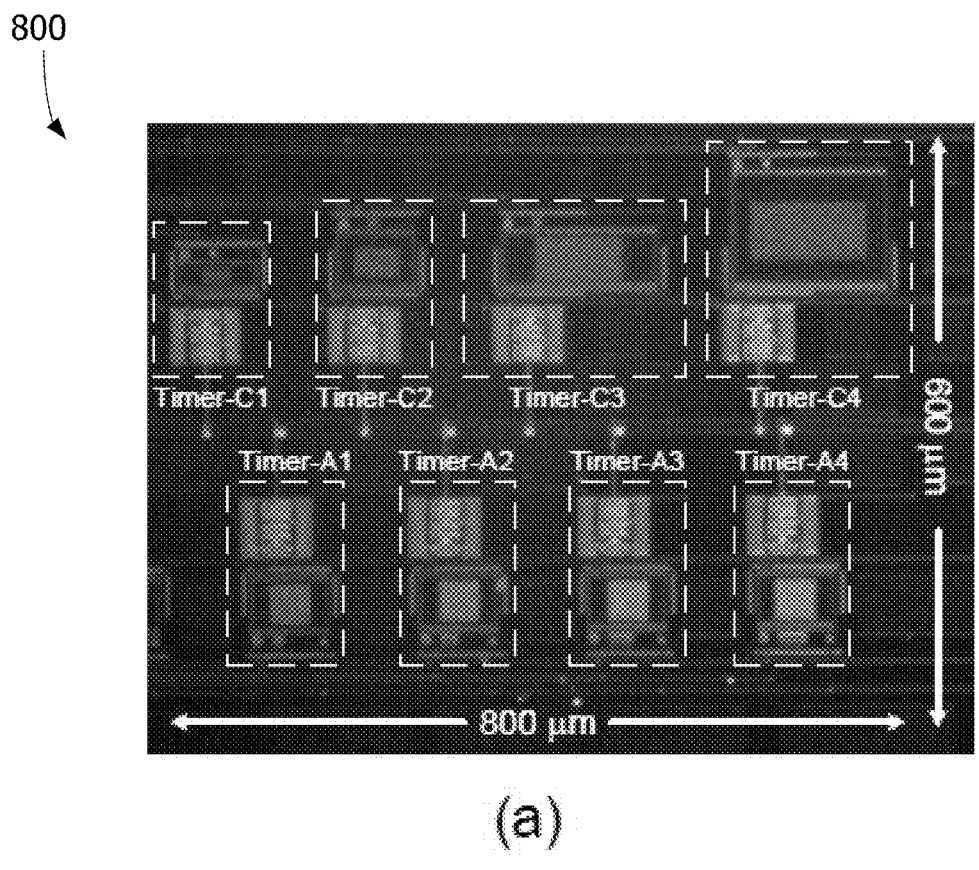
FIG. 8 is an example micro-photograph of fabricated timers without varactor-compensation.
Figure 9:
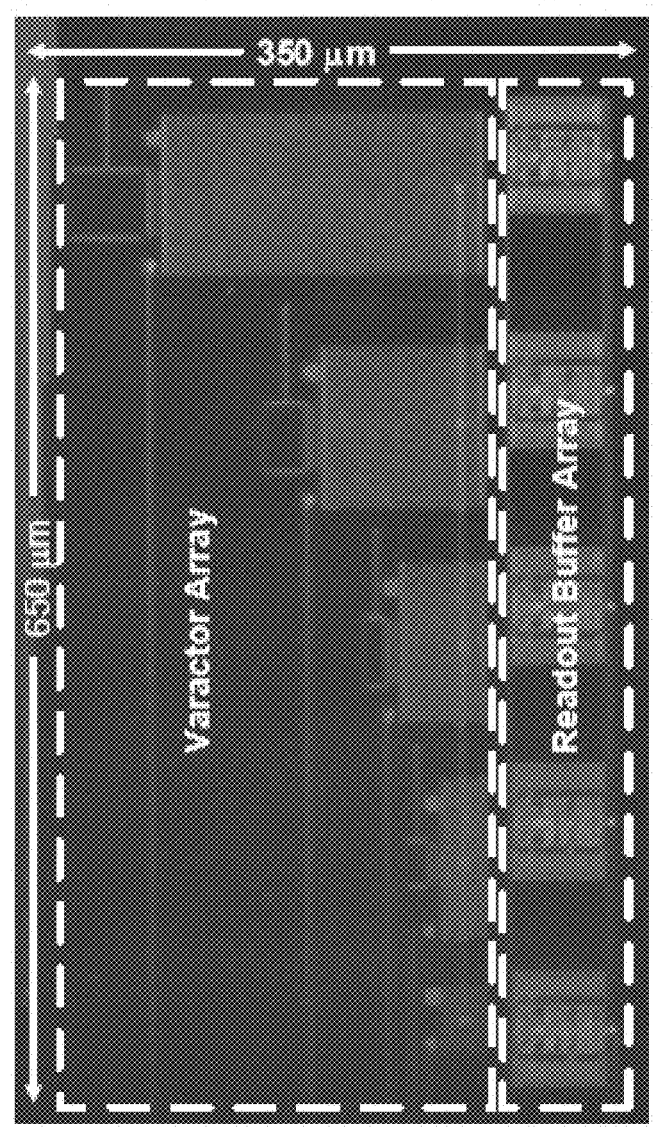
FIG. 9 is an example micro-photograph 900 of fabricated timers with varactor-compensation.

Example experiments were performed for self-powered timers similar to the timers shown in FIG. 5. Timers with different form factors with and without varactor-compensation were fabricated on an example 0.5-μm CMOS process. FIG. 8 is an example micro-photograph 800 of the fabricated timers without varactor-compensation and FIG. 9 is an example micro-photograph 900 of fabricated timers with varactor-compensation, and in particular, the array-based varactor-compensation. In the micro-photograph 800, eight timers without varactors are shown. Timer-C1 to Timer-C4 are example timers with the same tunneling junction area A but with different floating-gate capacitances $C_T$. Timer-A1 to Timer-A4 are example timers with the same floating-gate capacitance $C_T$ but with different tunneling junction areas A.

The micro-photograph 900 shows the schematics of an array of varactor-compensated timers where the FG node has been coupled to four groups of varactors. Each group comprises of a poly-poly capacitor $C_b$ and a MOS varactor $C_{var}$ corresponding to the circuit schematic shown in FIG. 4(b). The ratio of the cross-sectional area for the capacitors $C_b$ and $C_{var}$ was chosen to be 10:1. The floating-gates were programmed using a combination of Fowler-Nordheim (FN) tunneling and hot-electron injection. FN tunneling removes the electrons from the floating-gate node by applying a high-voltage (e.g., 15 V in 0.5 μm CMOS process) across a parasitic nMOS capacitor $C_{tun}$ (shown in FIG. 5). Hot-electron injection, however, requires lower voltage (e.g., 4.2 V in 0.5 μm CMOS process) than tunneling and hence was the primary mechanism for precision programming of floating-gates. The hot-electron programming procedure involves applying greater than 4.2 V across the source and drain terminals of the transistor M. The relatively large electric field near the drain of the pMOS transistor M creates impact-ionized hot electrons. When the energy of the hot electrons exceeds the gate-oxide potential barrier (e.g., 3.2 eV), the energy of the hot electrons may be injected onto the floating-gate. Because the hot-electron injection in a pMOS transistor is a positive feedback process and is used to add electrons to the floating gate, the process is controlled and periodically monitored to ensure the floating-gate voltage $V_{fg}$ is programmed to a desired precision. The desired precision may be achieved either by adjusting the duration for which the floating-gate transistor is injected or by adjusting the magnitude of the injection pulses.

Figure 10:
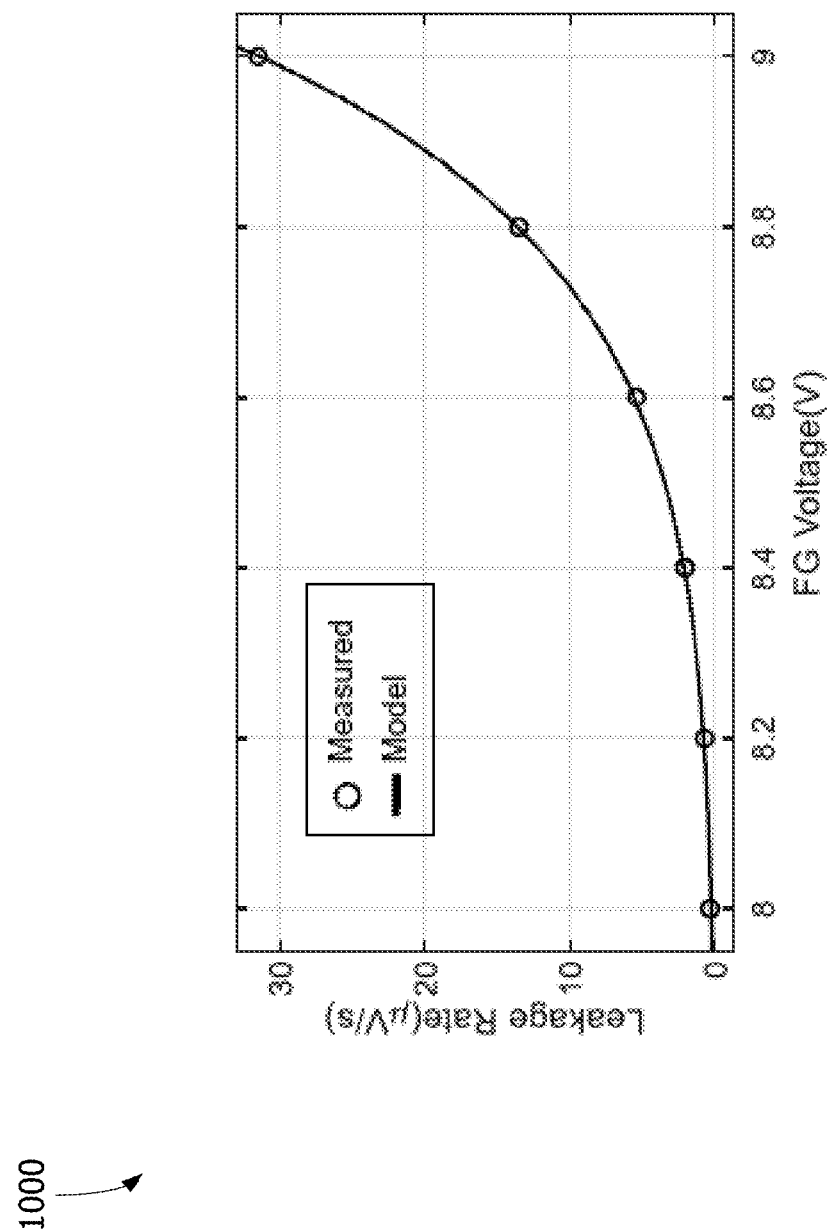
FIG. 10 is a graph of measured and modeled results for an example experiment comparing floating-gate voltages and leakage rates.

The first set of experiments was performed to verify the validity of the empirical FN tunneling current expressed by Equation 2. A timer structure with gate capacitance of $C_T$=4 pF and tunneling junction area of A=36 μm² was used to extract the relationship between leakage rate (proportional to the tunneling current) and the floating-gate voltage $V_{fg}$. FIG. 10 is a graph 1000 of the measured results of the floating-gate voltage $V_{fg}$ and the leakage rate from the experiment. The measured results agree with the FN current equation given by Equation 2.

TABLE 1

MODEL PARAMETERS FOR EXAMPLE FN TUNNELING TIMER

| Parameter | Value |
| --- | --- |
| $k_2$ | 87.49 |
| $k_1$ | $2.341 \times 10^8$ |
| $k_0$ | $1.037 \times 10^4$ |
| $V_{sub}$ | 3.94 |

Figure 11:
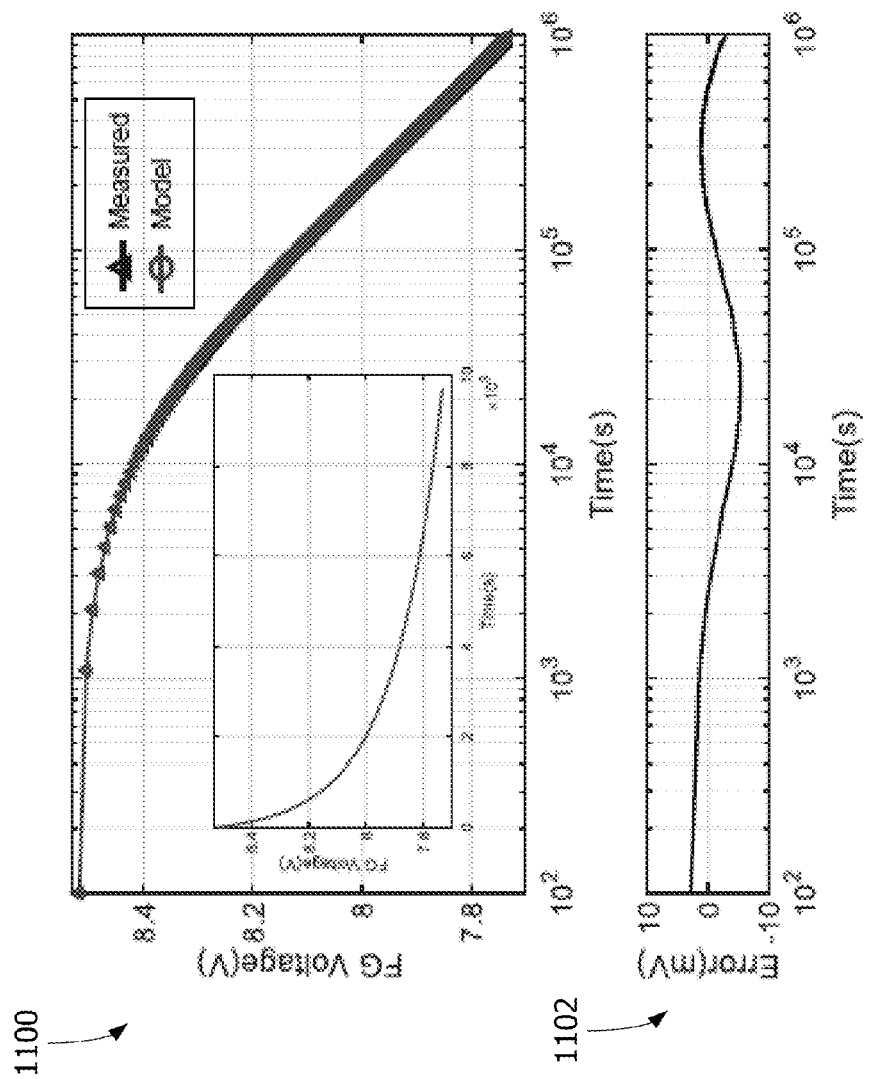
FIG. 11 is a set of graphs depicting measured and model results of a floating-gate voltage over time.
Figure 12:
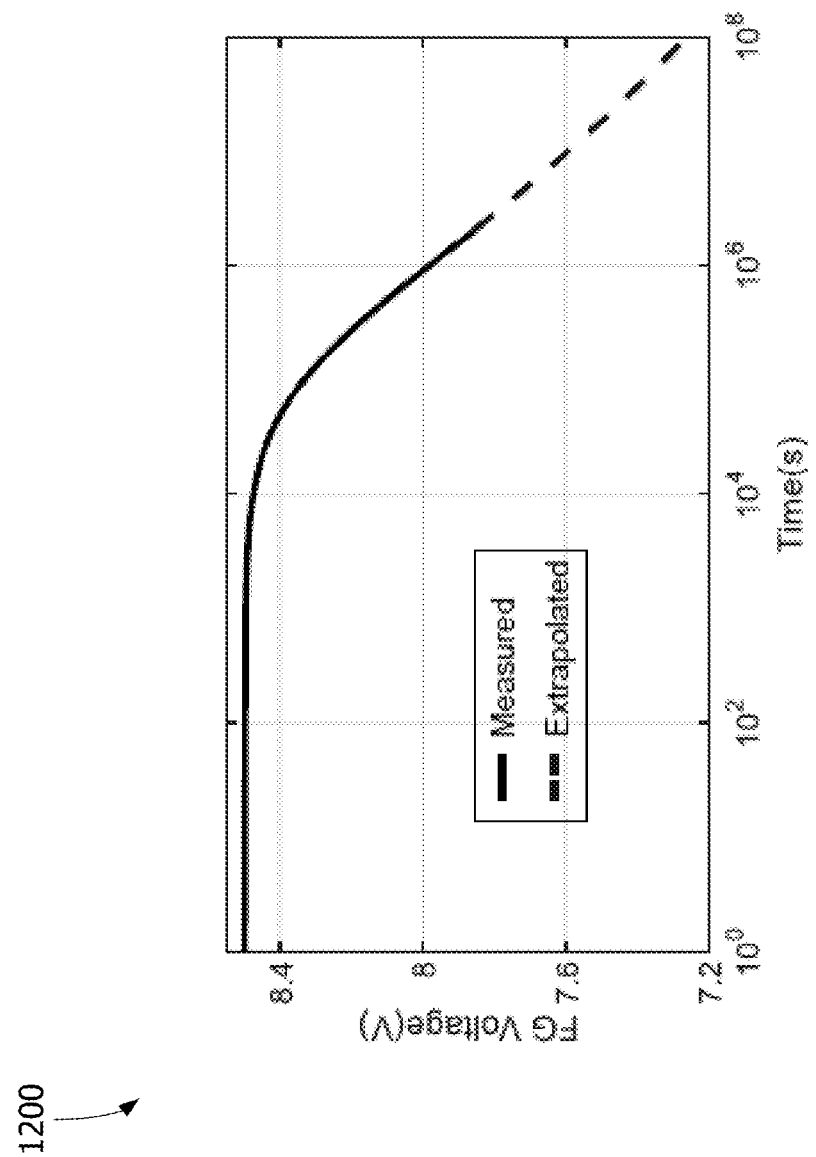
FIG. 12 is a graph illustrating an example timer response for measured data and extrapolated data to estimate a monitoring period or life cycle of a timer.

The second set of experiments was designed to verify the timer behavior model as given by Equation 9. Measurement results from Timer-A1 of FIG. 8 were used for estimating the model parameters shown in Table 1 above. FIG. 11 is a graph 1100 of the measured results and an error graph 1102 of the second set of experiments. The model error is measured to be smaller than 6 mV over a range of 700 mV, thereby implying a model accuracy greater than 40 dB. One of the benefits of using a reliable behavioral model is that it can be used for extrapolation experiments for predicting the timer's long-term response, which could be impractical for repeated experimental studies. For example, FIG. 12 is a graph 1200 illustrating a timer response for measured data and extrapolated data to estimate a life cycle of the timer. In this example, the gate capacitance $C_T$=16 pF and the tunneling junction area A=54 μm². The example timer is estimated to have a life cycle greater than three years. In addition, comparing the measured data points from the fabricated timer and the extrapolated behavioral response shows that the behavioral response exhibits an accurate fit up to $2 \times 10^6$ seconds or 550 hours.

A third set of experiments was conducted to verify that a varactor array is capable of programming the response of an FN-based timer according to the principle illustrated in FIG. 4. For the third set of experiments, the series capacitances $C_{b1}$ to $C_{b4}$ have been chosen to be 2 pF, 4 pF, 8 pF and 16 pF respectively. $C_{b1}$ and $C_{var1}$ in FIG. 4 were configured as a voltage divider for measuring the relatively high-voltage floating-gate voltage $V_{fg}$ using 3.3V CMOS read-out circuits.

Figure 13:
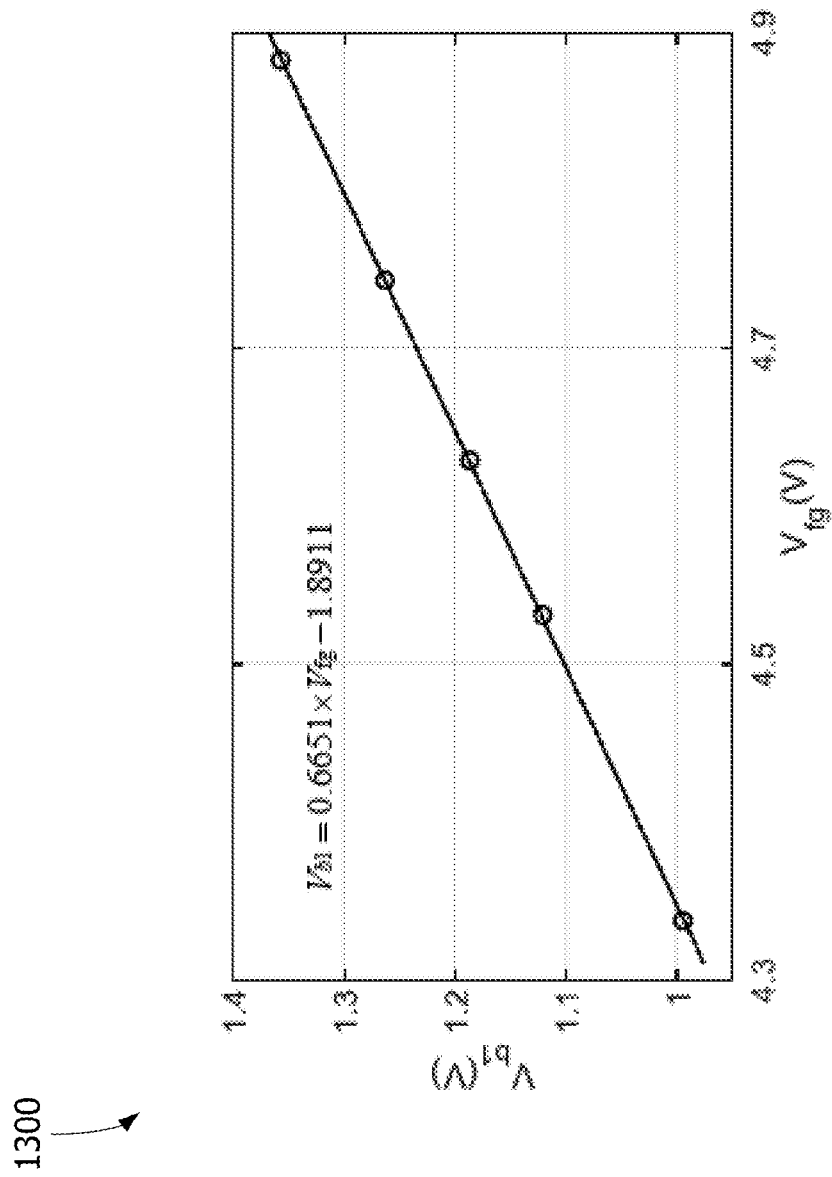
FIG. 13 is a graph showing example measurement results of the dependence of a floating node voltage on the floating-gate voltage.

FIG. 13 is a graph 1300 that illustrates measurement results of the dependence of $V_{b1}$ on $V_{fg}$. The results are linear and are captured by linear model equation $V_{b1}=0.6651\times V_{fg}-1.8911$, thereby enabling reliable and continuous tracking of the floating-gate voltage $V_{fg}$ using $V_{b1}$ when the timer is operational. Since each of the voltage parameters $V_{b2}$-$V_{b4}$ present a degree of freedom to tune the response of the timer, two specific biasing conditions were chosen to demonstrate the principle of varactor compensation. The bias values are summarized in Table 2 where Bias1 represents a group of values that will engage the varactor array, as shown in FIG. 5, whereas Bias2 represents a group of values that does not engage the varactor array, as shown in FIG. 5. The floating-gate node was programmed to the same initial voltage as represented by $V_{b1}$ in Table 2. The change of the floating-gate voltage $V_{fg}$ was recorded every 1000 seconds by measuring $V_{b1}$.

Figure 14:
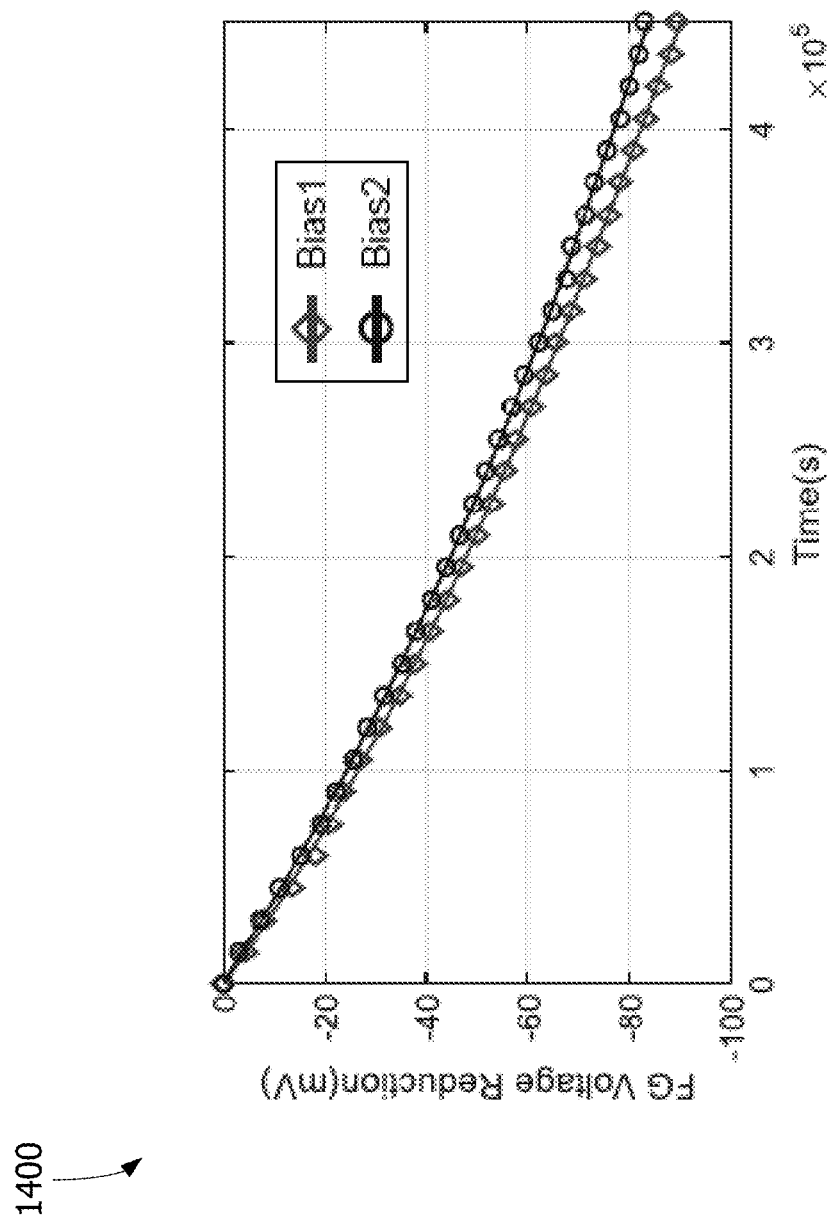
FIG. 14 is a graph that illustrates example recorded voltages for two different biasing conditions.

FIG. 14 includes a graph 1400 that illustrates the recorded voltages for the two biasing conditions. As can be seen in the graph 1400, within the same time interval, the timer with "Bias1" biasing condition exhibits a relatively larger dynamic range through varactor compensation in comparison to the timer corresponding to the biasing condition "Bias2".

TABLE 2

VARACTOR BIAS FOR THE COMPENSATED TIMER

| Parameter | Bias1 (V) | Bias2 (V) |
|---|---|---|
| $V_{b1}$ | 3.388 | 3.388 |
| $V_{b2}$ | 0.1780 | 0.6717 |
| $V_{b3}$ | 0.1227 | 0.5169 |
| $V_{b4}$ | 0.2275 | 0.3898 |

Figure 15:
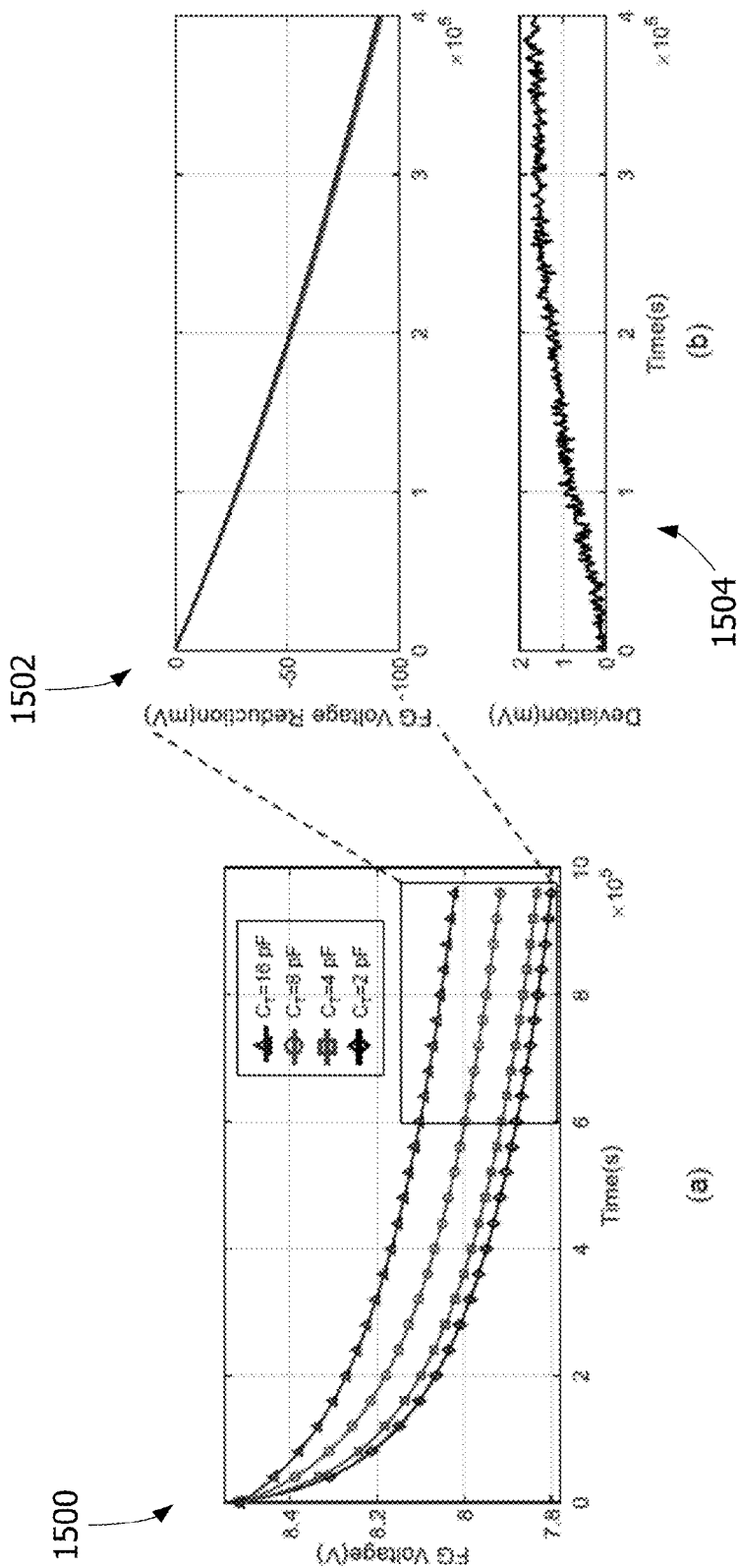
FIG. 15 is a set of graphs for an example experiment measuring changes in the floating-gate voltage over time for different floating-gate capacitances.

The next set of experiments was designed to verify the timer responses and the corresponding behavioral model for different values of: (a) floating-gate capacitances; and (b) tunneling junction areas. FIG. 15 is a graph 1500 depicting the measured values (highlighted by marked points) for floating-gate capacitances $C_T$ of 2 pF, 4 pF, 8 pF, and 16 pF respectively. For this experiment, the tunneling junction areas A for all the four timers were chosen to be 54 $\mu m^2$. The corresponding timer responses estimated using the behavioral model for each of the parameters (the floating-gate capacitance $C_T$ and the tunneling junction area A) is also plotted as a solid-line overlaying the measured data in the graph 1500. Two observations are derived from the measured results: (a) the behavioral model accurately predicts the response of the fabricated timers for different device parameters; and (b) a smaller capacitance produces a relatively faster change in the timer response. In addition, after the initial differences in respective timer responses, all of the timers changed in a near-identical fashion as shown in a reduction graph 1502 and a variation graph 1504 included in FIG. 15. The reduction graph 1504 plots the change in the timer outputs measured with respect to the output measured at a reference time ($t_0=6\times10^5$ s or 167 hours). The results show that the response changes by less than 2% even if the capacitances changes by more than 800%.

Figure 16:
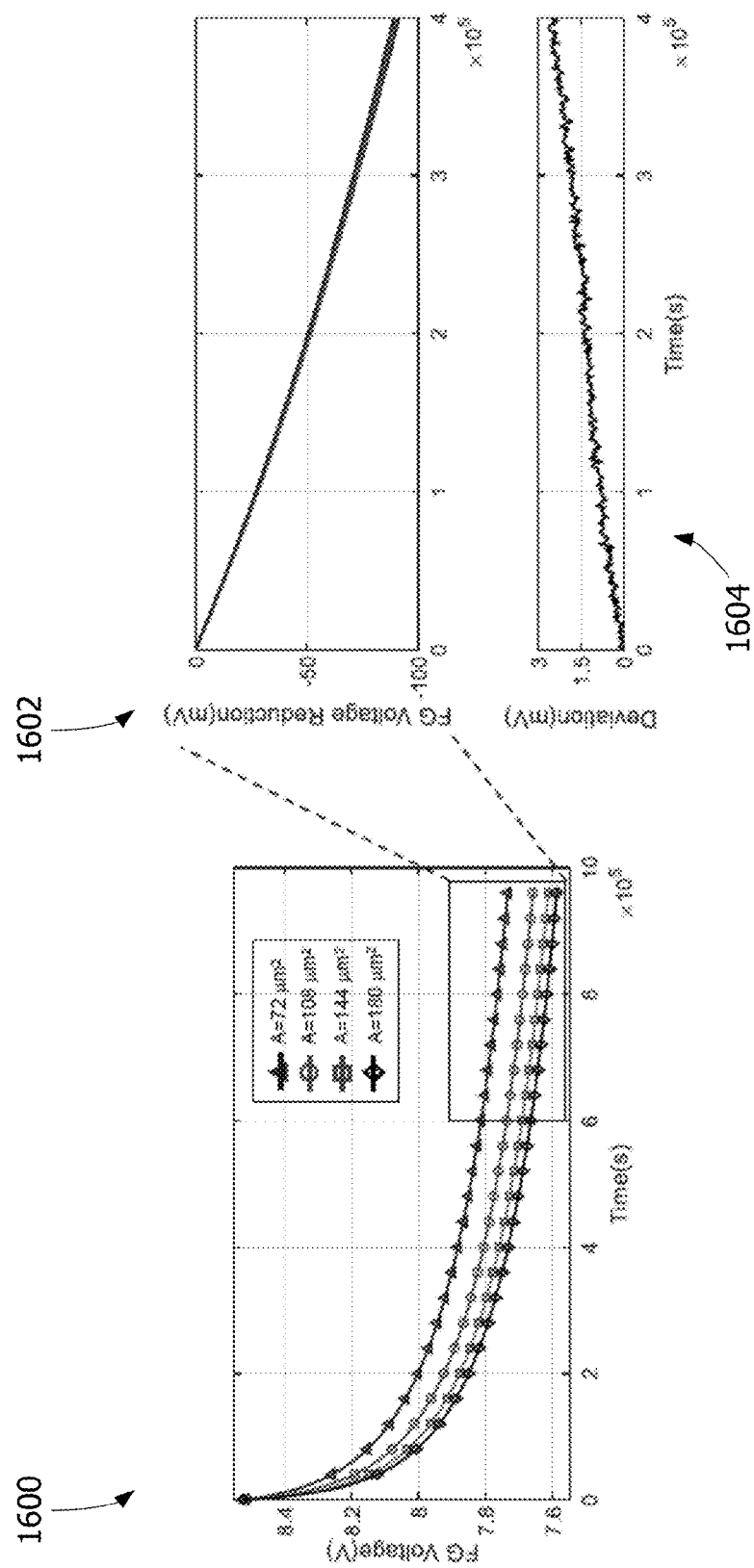
FIG. 16 is a set of graphs for an example experiment measuring changes in the floating-gate voltage over time for different tunneling junction areas.

A similar experiment was conducted for timers with different tunneling junction areas of 72 $\mu m^2$, 108 $\mu m^2$, 144 $\mu m^2$, and 180 $\mu m^2$, and for a fixed gate capacitance of $C_T=4$ pF. FIG. 16 is a graph 1600 of the floating-gate voltage over time that demonstrates a similar trend as the experiment shown in FIG. 15 where a smaller junction area produces a relatively larger initial change in the timer responses. However, as shown in reduction graph 1602 and variance graph 1604 of FIG. 16, after a reference time, all the timers exhibit a near identical response. The measured results further validate the robustness of the timing device, exhibiting less than 3% variation in the example experiments for junction areas that may vary by more than 100%.

Figure 17:
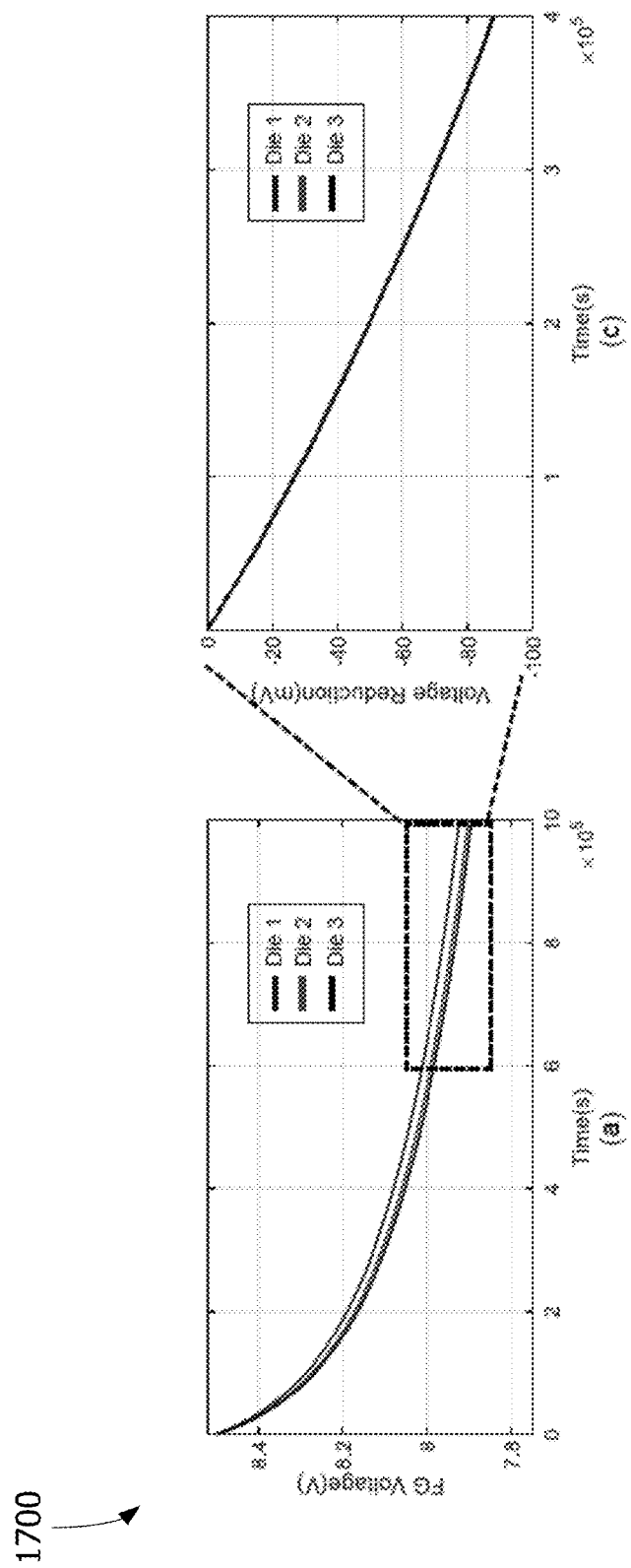
FIG. 17 is a graph depicting exampled measured timer responses for timers made using different manufacturing dies.
Figure 18:
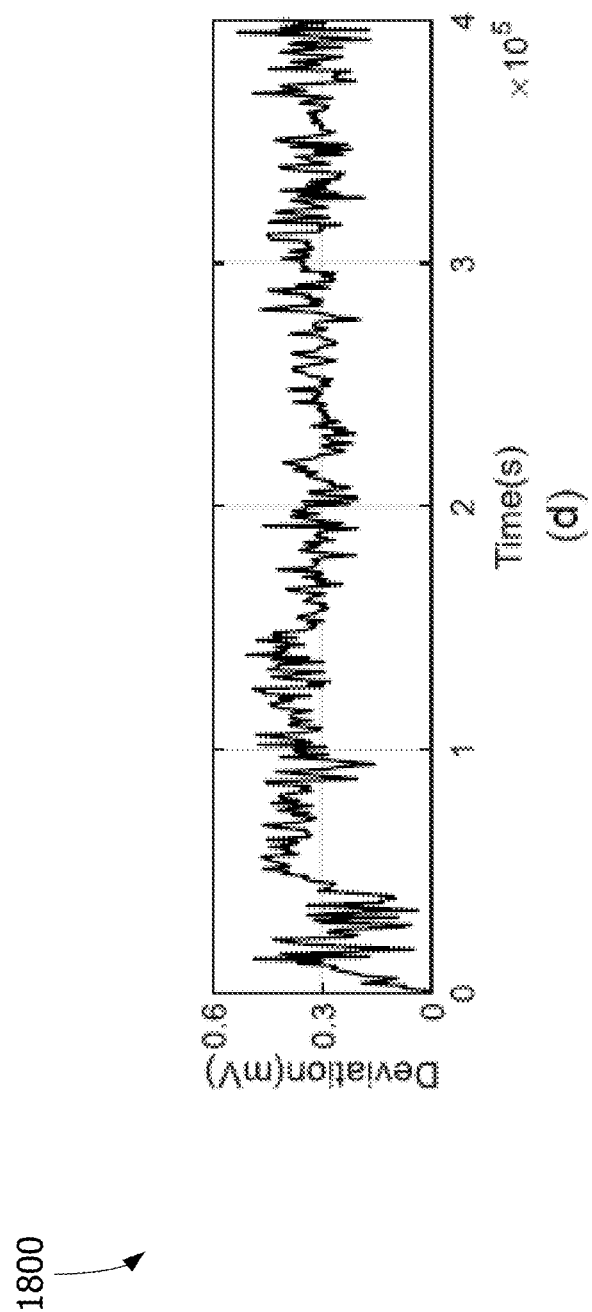
FIG. 18 is an example variance graph showing relative deviation in an example timer output with respect to other timer outputs of the timers shown in FIG. 17.

In the next set of experiments we verified the mismatch in the responses of identical timers fabricated on different silicon dies. For this experiment all timers were simultaneously programmed to "approximately" the same initial voltage and the timers were housed in an environment with similar conditions (i.e., temperature and humidity). FIG. 17 is a graph 1700 depicting the measured timer responses having a similar trend, where the initial timer responses vary due to mismatch, but then the responses reach an identical steady state response. FIG. 18 is a variance graph 1800 showing the relative deviation in the timer output value with respect to each other and the measured result exhibits less than 500 µV variation over a 100 mV operating span. This amounts to a synchronization accuracy greater than 46 dB.

When biased in a saturation regime, the FN-based timer modules exhibit a robust time-keeping response that is dependent on the device physics parameters and oxide thickness. However, in the foregoing modeling and analysis of the timer, the effect of temperature and other second order effects were ignored. A more complete expression for the FN tunneling current density J that captures these effects is given by Equation 19. Equation 19 includes an explicit dependence on temperature through $\gamma(T)$ and two correction terms $t(y)$ and $v(y)$ which captures the lowering of the triangular tunneling barrier through an image force effect. These correction terms are tabulated elliptic integrals, and y is a function of the barrier height and electric field as defined in Equation 20.

$$J = \alpha \frac{1}{t^2(y)} \gamma(T) E^2 \exp\left(-\frac{\beta v(y)}{E}\right) \tag{19}$$

$$y = \frac{1}{\phi}\left(\frac{q^3 E}{4\pi\epsilon_r\epsilon_0}\right)^{\frac{1}{2}} \tag{20}$$

Although the tunneling process itself is temperature independent, the number of electrons of a given incident energy on the barrier is a function of temperature T and the barrier height φ also depends on the temperature T. The dependence of electron momentum distribution on temperature can be corrected using $\gamma(T)$, which is defined by Equation 21, where c is defined by Equation 22.

$$\gamma(T) = \frac{\pi c k T}{\sin(\pi c k T)} \tag{21}$$

$$c = \frac{4\pi(2m^*\phi)^{\frac{1}{2}} t(y)}{hqE} \tag{22}$$

Figure 19:
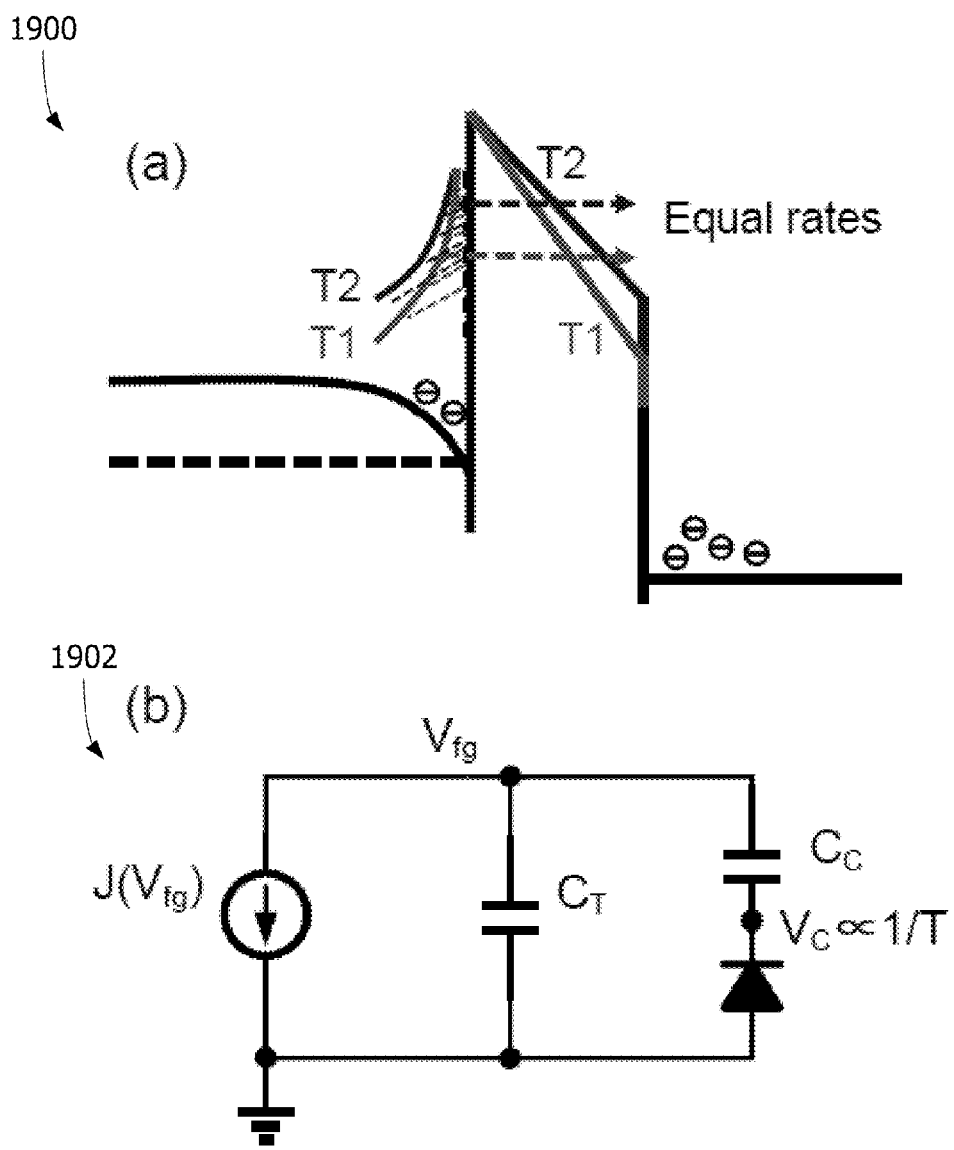
FIG. 19 is an example energy band diagram and an example circuit diagram illustrating the effects of variable temperature on a timer.

Once all the temperature and secondary effects are included in the timer differential equations, it may be practically impossible to obtain a closed-form behavioral model. However, the Equations 19-22 contain several self-compensating terms which still yield relatively consistent timer dynamics across different temperature conditions. The self-compensating phenomenon may be explained using an energy band-diagram 1900 shown in FIG. 19 as follows: the increase in temperature enhances the probability of electron occupancy of higher energy levels that see a narrower tunneling barrier through the triangular junction. As more electrons tunnel into the floating-gate, the shape of the tunneling barrier changes as shown in FIG. 19 and settles down to an equilibrium state which yields a long-term timer response measured for other temperatures.

Figure 20:
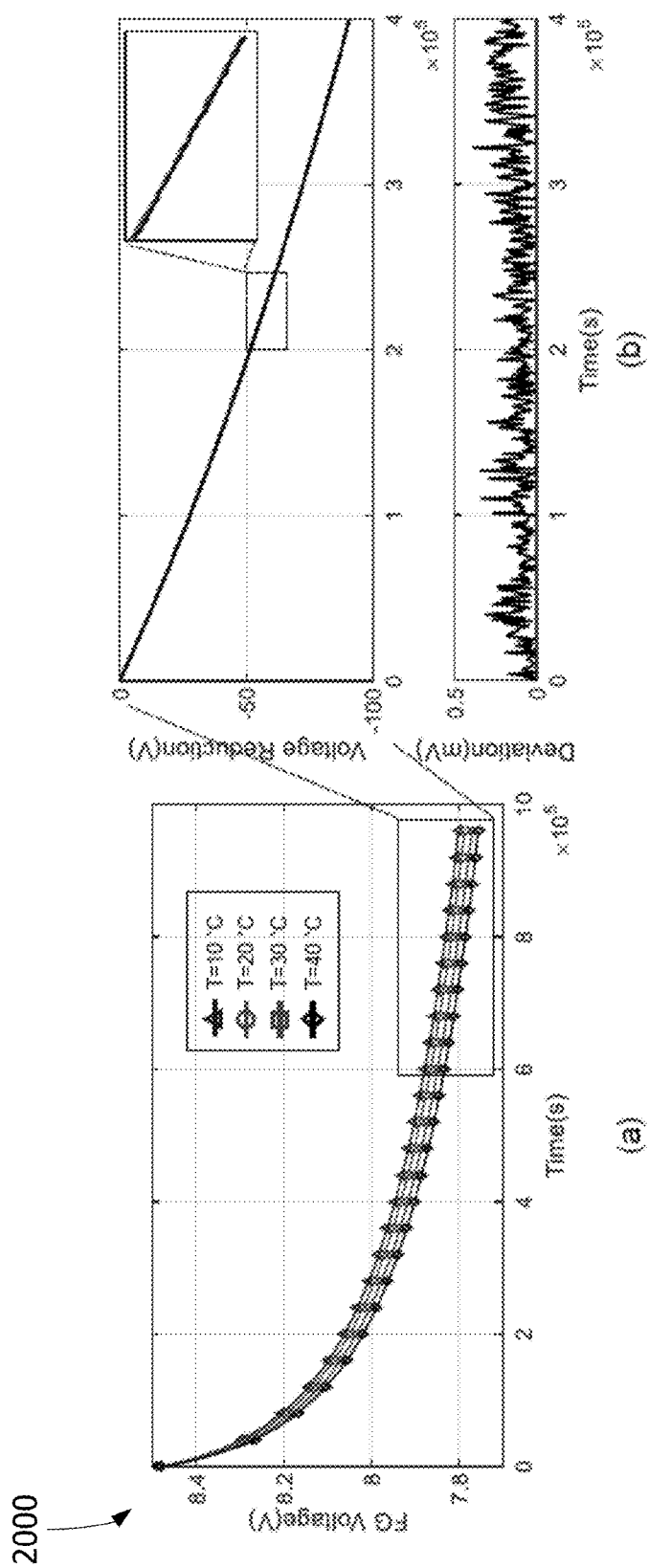
FIG. 20 is a set of graphs showing the difference in timer response for different temperatures.

A group of experiments were conducted to measure the temperature dependence of the timer. A fabricated timer with $C_T=2$ pF and $A=54$ μm² was housed in a temperature-controlled environment chamber and timer responses were obtained for four different temperature settings: 10° C., 20° C., 30° C., and 40° C. The measured responses are shown in a graph 2000 of FIG. 20. The initial timer responses show a faster rate with an increase in temperature because, for FN tunneling, electrons have to be thermally excited to cross the triangular FN barrier. However, the long-term response of the timer exhibits a self-compensating effect similar to that of the timers with different device parameters (FIGS. 15 and 16). Graph 2000 depicts the measured change in timer responses after a reference time of $6\times10^5$ s, the floating-gate voltage reduction shows a mismatch less than 0.4 mV across a range of 100 mV. The measured results demonstrate that two timers maintained at two different temperature levels (measured range of 30° C.) can still be synchronized with respect to each other up to an accuracy of 0.5%. In some embodiments, the timers may be synchronized to an accuracy greater than 0.5%.

However, for applications where temperature conditions vary, the timer's characteristics may deviate from the equilibrium response and settle to a new equilibrium response corresponding to the new temperature. Like varactor compensation, temperature compensation may be achieved by coupling a voltage signal to the floating-gate such that the magnitude of the coupling voltage decreases with an increase in temperature. The principle is shown in an example circuit diagram 1902 of FIG. 19, where a circuit element similar to a reverse-biased p-n junction or a pyroelectric device is capacitively coupled to the floating-gate. For the reverse-biased p-n junction, the built-in potential varies with temperature, whereas for the pyroelectric device the transient voltage generated is proportional to the change in temperature. For either of the mechanisms, the compensation range for the timer may be limited and the mechanisms may incorporate the use of calibration techniques like trimming to account for the limited compensation range.

Figure 23:
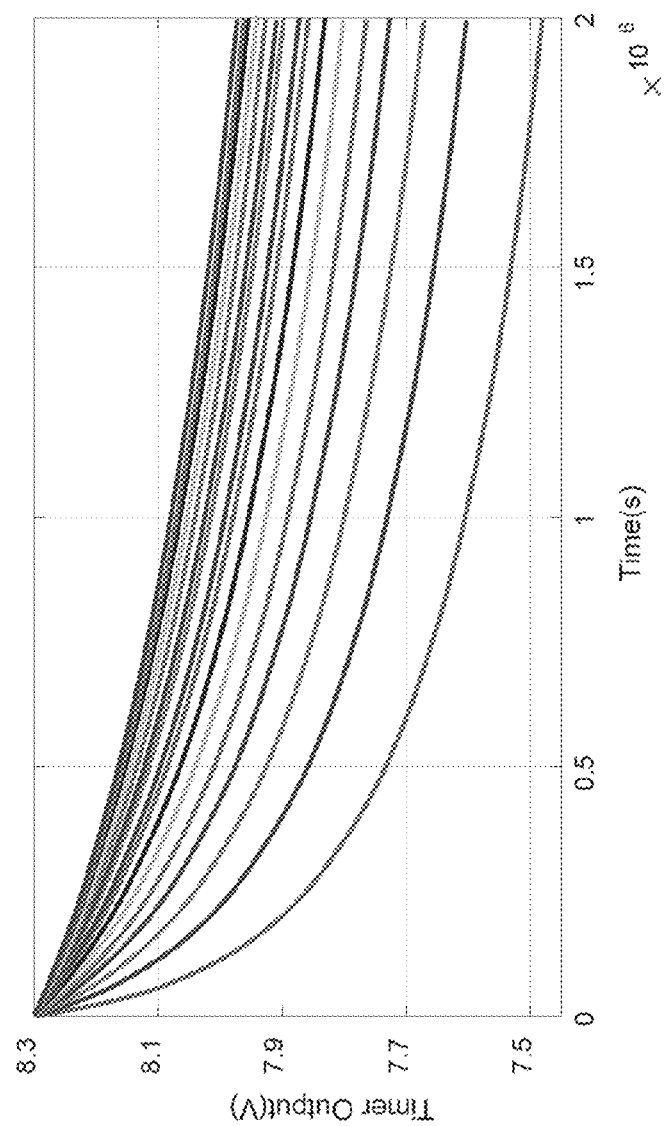
FIG. 23 is a graph of an example of a simulated response for a timer array.
Figure 24:
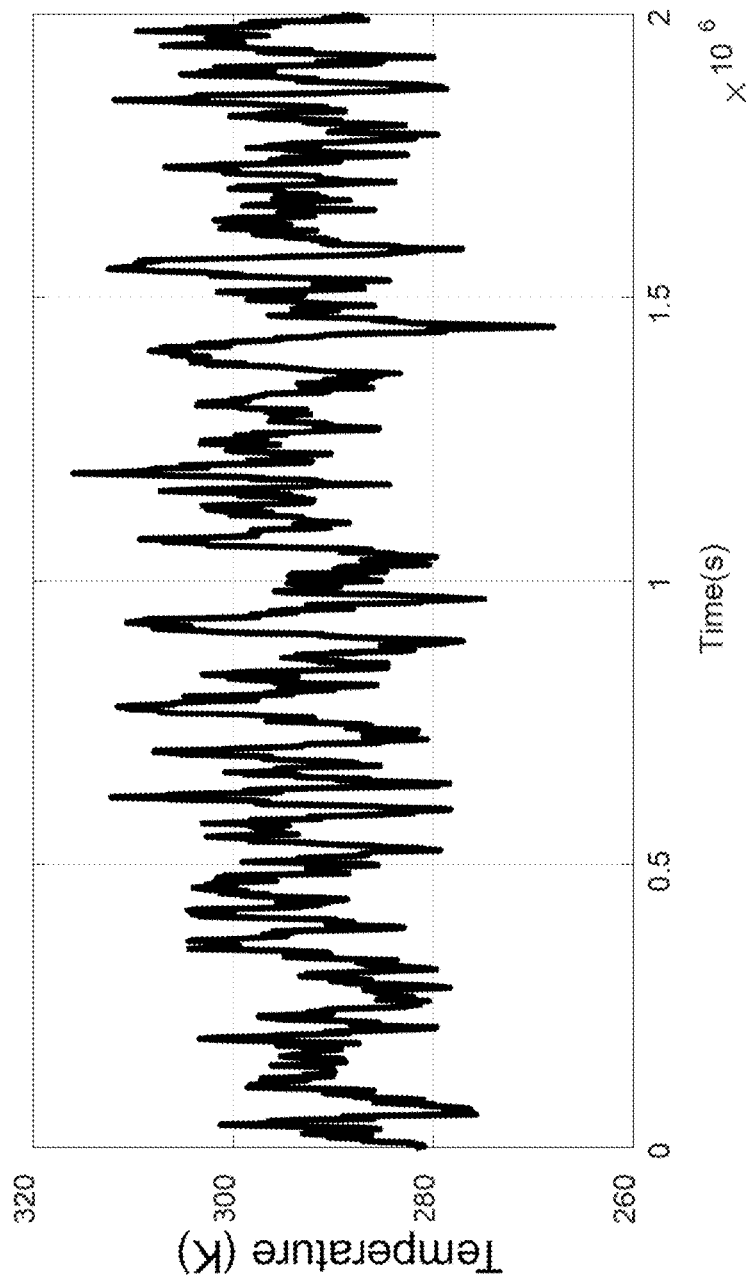
FIG. 24 is a graph of a temperature profile for the example of FIG. 23.
Figure 25:
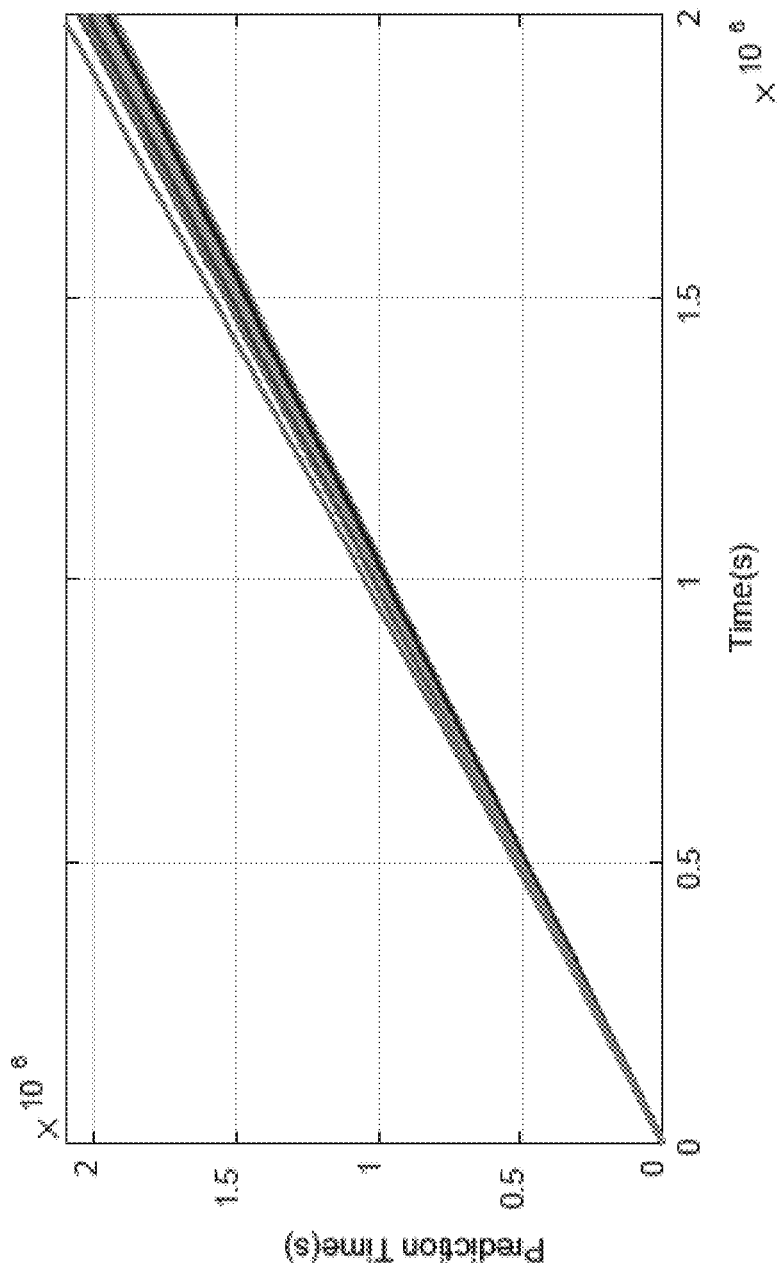
FIG. 25 is a graph of an ensemble response of a timer array.

In some embodiments, machine-learning regression may be implemented for temperature compensation. In embodiment using machine-learning regression, an array of self-powered timers is utilized, with each self-powered timer corresponding to different floating-gate capacitance. The output of the timers (with different capacitances) will converge to the same rate-of-change, due to a self-compensating physics of FN tunneling. However, any variations in temperature will affect each of the timers differently. This is illustrated in FIG. 23, which shows the simulated response of a timer array for a temperature variation profile shown in FIG. 24. When each of the timers (with different capacitance) is individually used to predict the elapsed time, it results in an ensemble response shown in FIG. 25. Note that the spread (or variance across the timers) is also an indicator of time. A machine learning approach (for example a support vector machine regression) may be used to regress the spread of the ensemble output to the true predicted time. In this approach, any multi-variate regression procedure may be used and the regression parameters stored as a calibration data. The stored calibration data may then be applied to different timer arrays and to different temperature variation profiles.

The limited compensation range is also true for the varactor compensation used enhance the timer dynamic range. The relatively small slope in the varactor C-V characteristics limits the compensation ability of the method. An alternative approach may employ an NMOS transistor biased in a weak inversion mode. The MOS capacitance biased at the weak inversion region has a stronger dependence on the gate voltage in comparison to the varactor compensation and the slope of C-V characteristics is higher.

Figure 21:
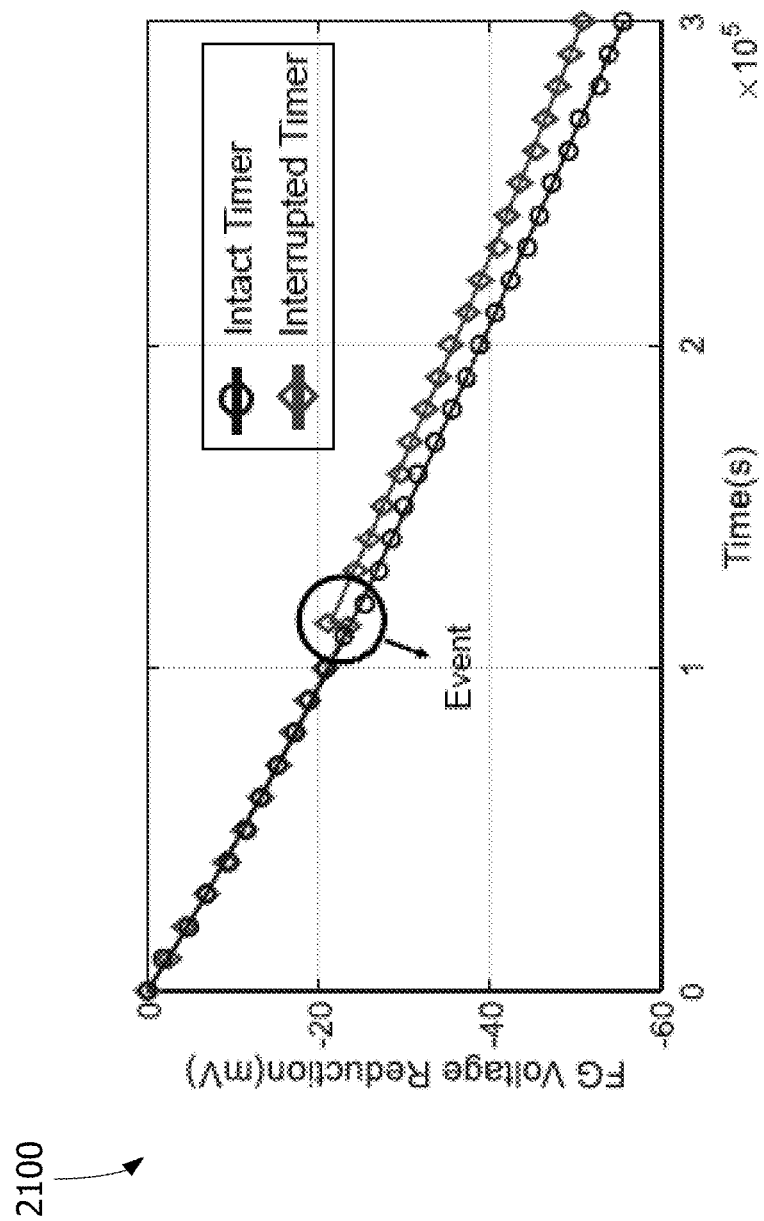
FIG. 21 is a graph of an example experiment comparing responses of two timers, one of which experienced a power surge.

When a plurality of timers are used within a timer module and/or multiple timer modules are integrated into a system or device, averaging techniques may be used to alleviate the effect of noise (e.g., due to electron transport and measurement) on the timer outputs. The use of an array of timers may facilitate identifying and isolating defective timers. For example, a median response of the array of timers may be used for time-keeping. The array is also used to detect tampering events as well. An example of this is illustrated in FIG. 21 using the measured response from a pair of timers. FIG. 21 is a graph 2100 of an example experiment comparing the responses of two timers, one of which experienced a power surge (i.e., an indicator of tampering or snooping). This isolated event led to the desynchronization of the timers with respect to each other and can be readily detected. In this regard, an array of timers experiencing a similar desynchronization effect due to an unexpected event are used to facilitate reducing false-alarms and isolating desynchronization effects due to defective timers.

Figure 22:
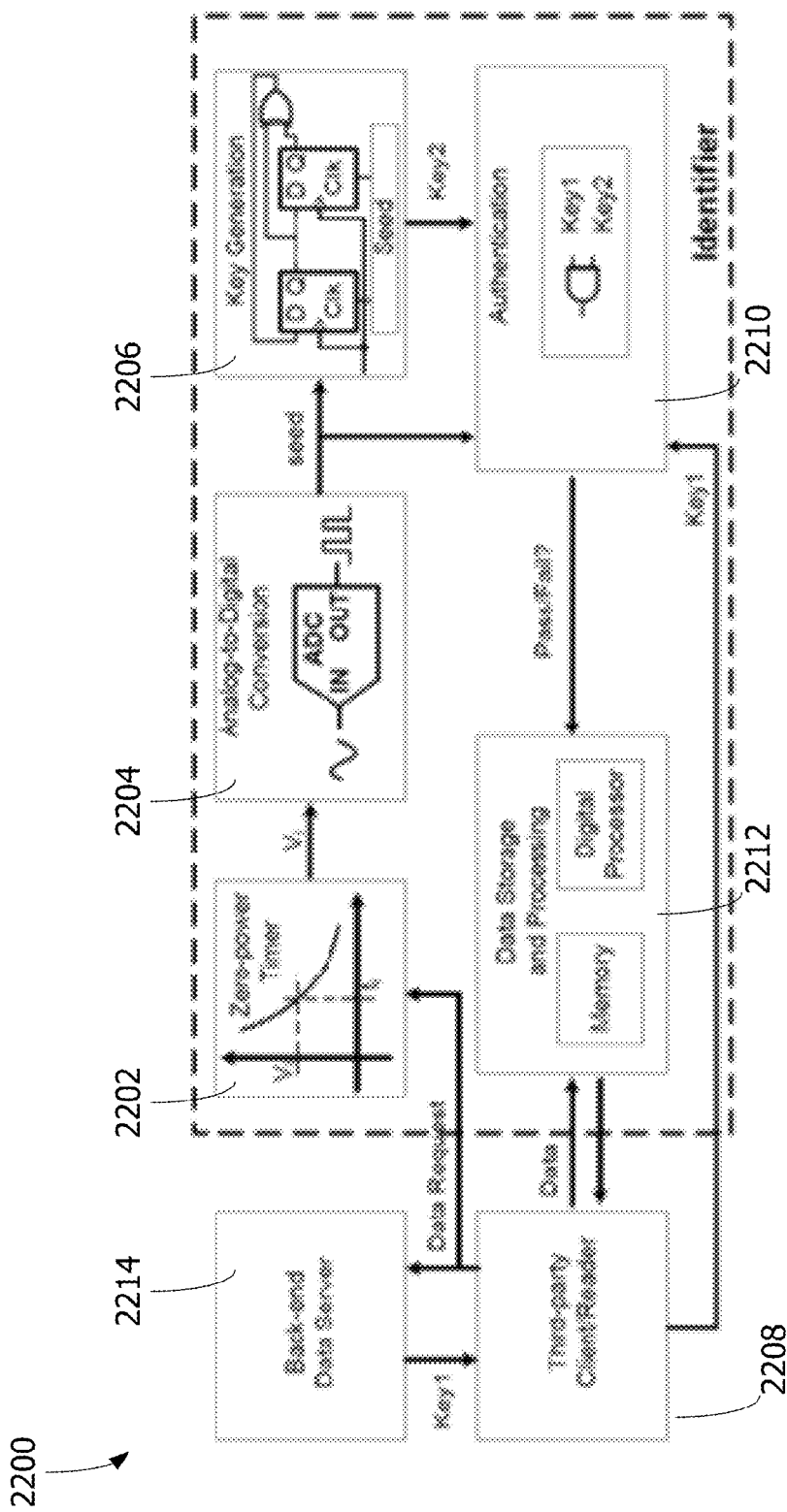
FIG. 22 is an example authentication system that may use the timer module shown in FIG. 5.

FIG. 22 is a data flow diagram of an example authentication protocol using an example authentication system 22000. The system 2200 is substantially similar to the system 200 shown in FIG. 2. The system 2200 includes a timer module 2202, an analog-to-digital converter (ADC) 2204, a key generator 2206, a client device 2208, an authentication module 2210, a data computing device 2212, and a back-end server 2214. With respect to FIG. 2, the timer module 2202, the ADC 2204, and/or the key generator 2206 may be integrated within a passive device similar to the requesting device 202. The client device 2208, the authentication module 2210, the data computing device 2212, and the back-end server 2214 represent at least one or more of the read-out interface 204, the authentication device 206, and the synchronization device 208 shown in FIG. 2.

At a point of sale or authentication, a data request from the client device 2208 is made to the timer module 2202 to provide a timer output. In at least some embodiments, the client device 2208 is associated with a merchant or other party that is prompting a requestor to provide authentication. The timer output of the timer module 2202 (i.e., a floating-gate voltage measurement) is converted into a digital seed using the ADC 2204. The seed serves as an input to the key generator 2206 to produce "key2". That is, the key generator 2206 generates a randomized key2 based on the seed. The key generator 2206 transmits the key2 to the authentication module 220 to perform an authentication process.

At the same time, key1 is requested by the client device 2208 from the back-end server, which implements a software timer module that emulates the timer module 2202 and a key generator (not shown) substantially similar to the key generator 2206. Both keys are randomly generated based on a synchronized timer output such that requesting the keys at different times will cause different keys to be generated. In this manner, even if key2 is stolen, counterfeited or eavesdropped by a third-party it will be difficult to predict the next key. The client device 2208 transmits the key1 to the authentication module 2210. In certain embodiments, the authentication module 2210 is integrated within the data computing device 2212 physically or as a set of computer instructions. In other embodiments, the authentication module 2210 is a separate computing device in communication with the data computing device. Both the keys (key1 and key2) are compared to each other to authenticate the transaction. If the keys substantially match, the transaction is authenticated. The authentication module 2210 transmits an authentication output to the data computing device 2212 and/or the client device 2214 to complete the authentication process.

The foregoing systems and methods describe self-powered timer modules that facilitate long-term, accurate timekeeping for embedded systems. In particular, the foregoing systems and methods facilitate substantially continuous time-keeping in passive authentication devices using ambient environment energy to enable dynamic authentication methods to be implemented. The above-described timer modules generate timer outputs independent of device sizes, and therefore are robust to fabrication mismatch and may be used to achieve synchronicity with other timer modules. Moreover, the varactor-based compensation of the timer modules enables the timer modules to generate a quasi-linear response and adjust the monitoring period of the timer modules according to a user's specifications.

Although the foregoing systems and methods include the timer modules for authentication techniques, it is to be understood that other systems may use the timer modules to perform the same or alternative functions. For example, the timer modules may be used as extended-duration watchdog timers to identify the expiration of an associated product (e.g., pills, food, etc.) and/or to disable the functionality of products after a predetermined period of time. In another example, the timer modules may continuously track time for devices with an extended unpowered state, such as during shipping or during display at a merchant's store. In some embodiments, the timer modules are used to facilitate secure communications through encryption based on synchronized timer outputs of the timer modules.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A timer module comprising:
    a timer configured to measure time over a first monitoring period, the timer comprising:
        a floating-gate configured to store electrons, the floating-gate having an initial state and a measured state, the measured state including a current time and a current floating-gate voltage; and
        an energy barrier positioned adjacent the floating-gate, the energy barrier configured to leak the electrons from an ambient environment of the timer to the floating-gate at a predetermined leakage rate using Fowler-Nordheim (FN) tunneling; and
    a compensation circuit coupled to the timer, the compensation circuit configured to selectably adjust the first monitoring period.

2. The timer module in accordance with claim 1, wherein the compensation circuit comprises a varactor configured to adjust a first capacitance of the floating-gate to a second capacitance, wherein the first monitoring period is adjusted to a second monitoring period based on the second capacitance.

3. The timer module in accordance with claim 1, wherein the predetermined leakage rate is fixed with respect to variable capacitance of the floating-gate and variable tunneling junction area of the energy barrier.

4. The timer module in accordance with claim 1, wherein the compensation circuit comprises a series capacitor network.

5. The timer module in accordance with claim 1, wherein floating-gate is comprised of a strip of poly-crystalline silicon.

6. The timer module in accordance with claim 1, wherein the energy barrier is a triangular quantum-mechanical energy barrier comprised of silicon-dioxide.

7. The timer module in accordance with claim 6, wherein a base of the triangular quantum-mechanical energy barrier is greater than 10 nanometers.

8. The timer module in accordance with claim 1, further comprising:
    a plurality of timers; and
    calibration data correlating variance among the plurality of timers with a predicted time.

9. A timer module comprising:
    a plurality of timer circuits operable to output a time dependent voltage, each timer circuit comprising:
        a floating-gate configured to store electrons, the floating-gate having an initial state and a measured state, the measured state including a current time and a current floating-gate voltage; and
        a triangular quantum-mechanical energy barrier positioned adjacent the floating-gate, the triangular quantum-mechanical energy barrier configured to leak the electrons from an ambient environment of the timer to the floating-gate at a predetermined leakage rate using Fowler-Nordheim (FN) tunneling;
    a plurality of variable capacitors coupled to the plurality of timer circuits, the plurality of variable capacitors operable to adjust a floating gate capacitance of each timer circuit.

10. The timer module of claim 9, wherein the floating-gate is comprised of a strip of poly-crystalline silicon.

11. The timer module of claim 9, wherein the triangular quantum-mechanical energy barrier is comprised of silicon-dioxide.

12. The timer module of claim 11, wherein a base of the triangular quantum-mechanical energy barrier is greater than 10 nanometers.

* * * * *